US011175346B2

(12) United States Patent
Schweitzer et al.

(10) Patent No.: US 11,175,346 B2
(45) Date of Patent: Nov. 16, 2021

(54) POWER SUPPLY MONITORING SYSTEMS AND METHODS USING ULTRASONIC SENSORS

(71) Applicant: Amazon Technologies, Inc., Seattle, WA (US)

(72) Inventors: Ben Martin Schweitzer, Seattle, WA (US); Jean-Guillaume Dominique Durand, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 199 days.

(21) Appl. No.: 16/417,380

(22) Filed: May 20, 2019

(65) Prior Publication Data

US 2020/0371165 A1    Nov. 26, 2020

(51) Int. Cl.
| | |
|---|---|
| *G01R 31/392* | (2019.01) |
| *G01R 31/387* | (2019.01) |
| *H01M 10/42* | (2006.01) |
| *H01M 10/48* | (2006.01) |
| *G01N 29/44* | (2006.01) |

(Continued)

(52) U.S. Cl.
CPC ......... *G01R 31/392* (2019.01); *G01N 29/075* (2013.01); *G01N 29/12* (2013.01); *G01N 29/44* (2013.01); *G01R 31/387* (2019.01); *H01M 10/425* (2013.01); *H01M 10/482* (2013.01); *G01N 2291/012* (2013.01); *H01M 2220/20* (2013.01)

(58) Field of Classification Search
None
See application file for complete search history.

(56) References Cited

U.S. PATENT DOCUMENTS

| | | |
|---|---|---|
| 6,674,265 B2 | 1/2004 | Yoshida et al. |
| 7,218,078 B2 | 5/2007 | Gagnon et al. |
| 7,783,438 B2 | 8/2010 | Redko et al. |
| (Continued) | | |

FOREIGN PATENT DOCUMENTS

| | | |
|---|---|---|
| CN | 107742753 A | 2/2018 |
| EP | 2915490 A1 | 9/2015 |

OTHER PUBLICATIONS

International Search Report and Written Opinion dated Aug. 11, 2020, for Application No. PCT/US2020/033378.

*Primary Examiner* — Jermele M Hollington
(74) *Attorney, Agent, or Firm* — Athorus, PLLC

(57) ABSTRACT

Systems and methods to measure states of charge of a battery may include an ultrasonic sensor and a control system. For example, the control system may instruct the ultrasonic sensor to emit ultrasonic waves toward a battery, and may instruct the ultrasonic sensor to receive echoes of the emitted ultrasonic waves reflected back from the battery. In addition, the control system may process data associated with the emitted waves and received echoes, including properties associated with the waves and echoes, such as a time of flight, frequency, amplitude, wavelength, phase, duration, or others. Based on the properties of the received echoes, and by comparison with expected properties, various physical, mechanical, chemical, and/or material characteristics of the battery may be determined, based on which a state of charge and/or a state of health of the battery may further be determined.

20 Claims, 12 Drawing Sheets

(51) Int. Cl.
*G01N 29/12* (2006.01)
*G01N 29/07* (2006.01)

(56) References Cited

U.S. PATENT DOCUMENTS

| | | |
|---|---|---|
| 7,967,711 B2 | 6/2011 | Conlon et al. |
| 8,798,832 B2 | 8/2014 | Kawahara et al. |
| 9,397,371 B2 | 7/2016 | Nishi et al. |
| 9,434,267 B2 | 9/2016 | Wang et al. |
| 9,552,682 B2 | 1/2017 | Luke et al. |
| 9,577,443 B2 | 2/2017 | Gach et al. |
| 9,634,508 B2 | 4/2017 | Kearns et al. |
| 9,834,306 B2 | 12/2017 | Almasoud |
| 10,014,701 B2 | 7/2018 | Toya |
| 10,085,326 B2 | 9/2018 | Siefer et al. |
| 10,132,781 B2 | 11/2018 | Steingart et al. |
| 10,328,805 B1 | 6/2019 | Wyrobek et al. |
| 10,580,311 B2 | 3/2020 | Schmalzried et al. |
| 10,663,525 B2 | 5/2020 | Shen et al. |
| 10,886,759 B2 | 1/2021 | Zheng et al. |
| 10,899,445 B2 | 1/2021 | Augugliaro et al. |
| 10,944,279 B1 | 3/2021 | Chen et al. |
| 2015/0327839 A1 | 11/2015 | Kim et al. |
| 2016/0190844 A1 | 6/2016 | Sandvik et al. |
| 2017/0093187 A1 | 3/2017 | Park et al. |
| 2017/0104353 A1* | 4/2017 | Zhao .................... B64C 39/024 |
| 2017/0179774 A1 | 6/2017 | Jin et al. |
| 2018/0183252 A1 | 6/2018 | Kim et al. |
| 2019/0047699 A1* | 2/2019 | Bonden ................ G05D 1/0011 |
| 2019/0147751 A1* | 5/2019 | Sasao ................... G08G 5/0039 701/3 |
| 2019/0207274 A1 | 7/2019 | Ladpli et al. |
| 2019/0369057 A1* | 12/2019 | Mattar ................. B64C 39/024 |
| 2019/0375510 A1* | 12/2019 | Qiu ....................... B64D 27/24 |
| 2020/0369171 A1* | 11/2020 | Schweitzer ............ B60L 53/62 |
| 2020/0371165 A1* | 11/2020 | Schweitzer .......... G01N 29/346 |
| 2020/0373767 A1* | 11/2020 | Schweitzer ............. B60L 53/36 |

* cited by examiner

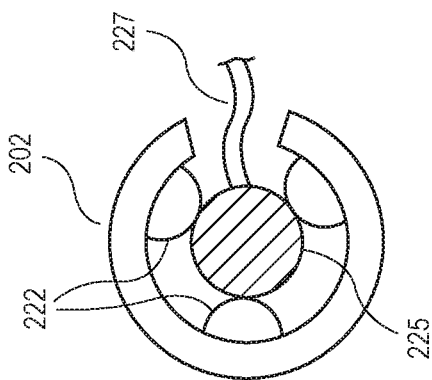
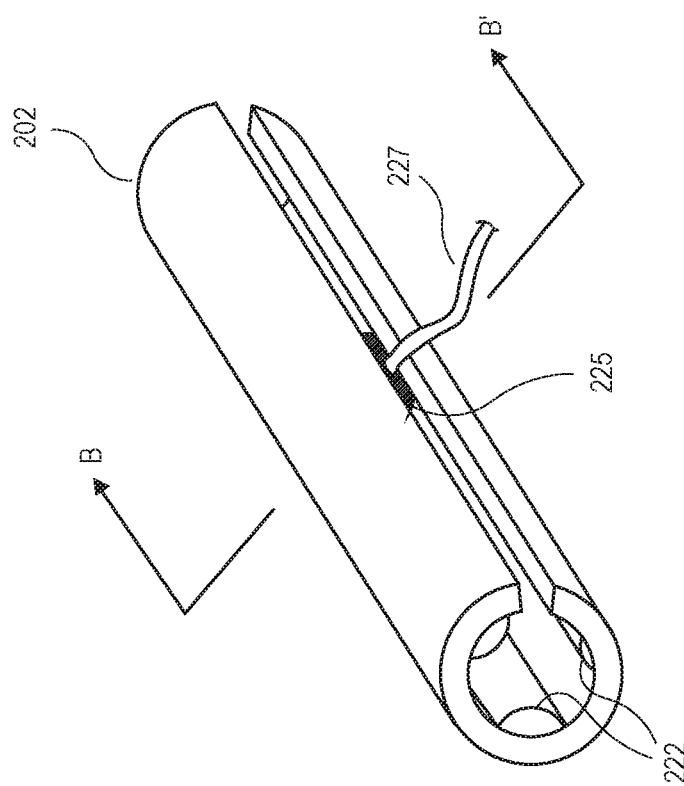
FIG. 2B
FIG. 2A

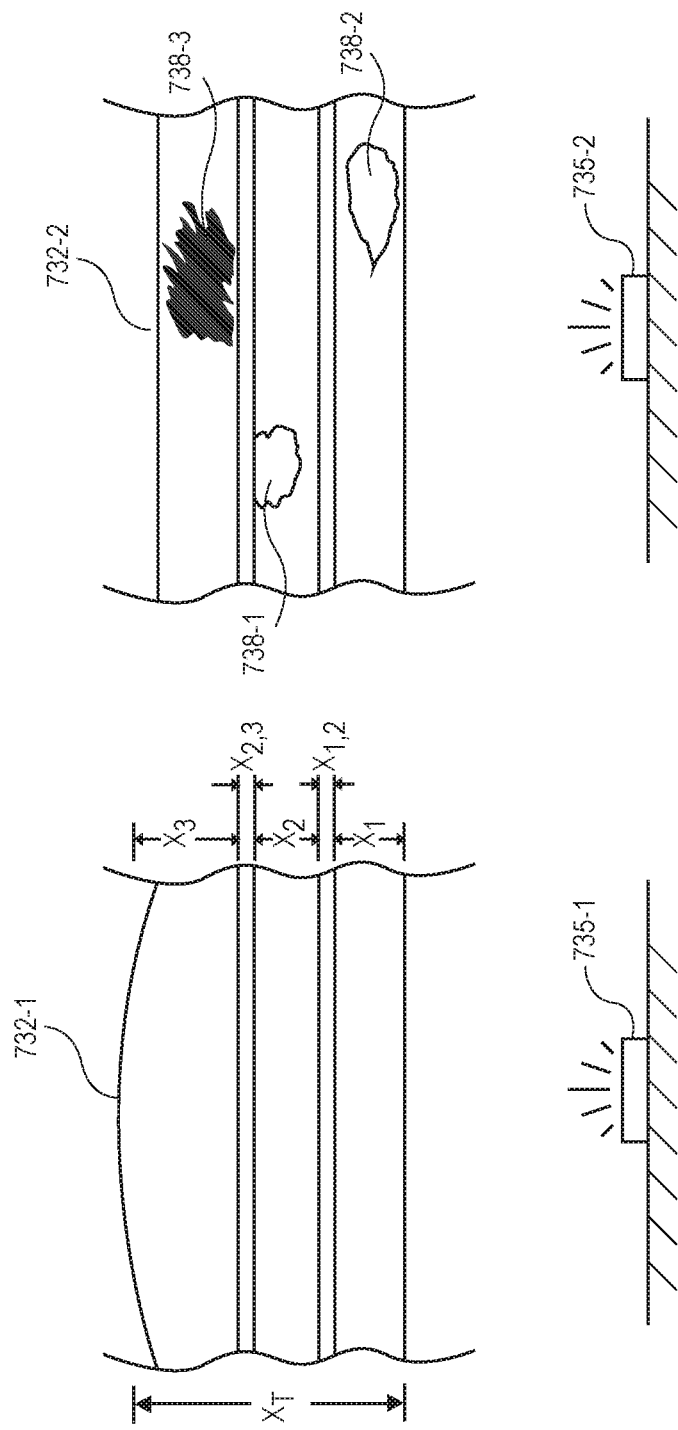

POWER SUPPLY MONITORING SYSTEMS AND METHODS USING ULTRASONIC SENSORS

BACKGROUND

Batteries are increasingly used in vehicles, such as electric automobiles and aerial vehicles, including autonomous or unmanned aerial vehicles. When batteries are used as primary power sources for a fleet of vehicles, it is desirable to measure and manage the states of charge and/or health of the batteries to ensure availability and operability of the fleet of vehicles. Existing systems for managing states of charge and/or health of batteries for a fleet of vehicles may be slow and inefficient, while also detrimentally affecting the useful lives of the batteries. Accordingly, there is a need for systems and methods to measure and manage states of charge and/or states of health of batteries with improved speed and efficiency, while also maximizing the useful lives of the batteries.

BRIEF DESCRIPTION OF THE DRAWINGS

The detailed description is presented with reference to the accompanying figures. In the figures, the left-most digit(s) of a reference number identifies the figure in which the reference number first appears. The use of the same reference numbers in different figures indicates similar or identical components or features.

FIGS. 2A and 2B are schematic diagrams of a first example rail of an example aerial vehicle maintenance system, in accordance with disclosed implementations.

FIGS. 7A and 7B are schematic, close-up diagrams of example ultrasonic battery state detection systems, in accordance with disclosed implementations.

Figure 1:
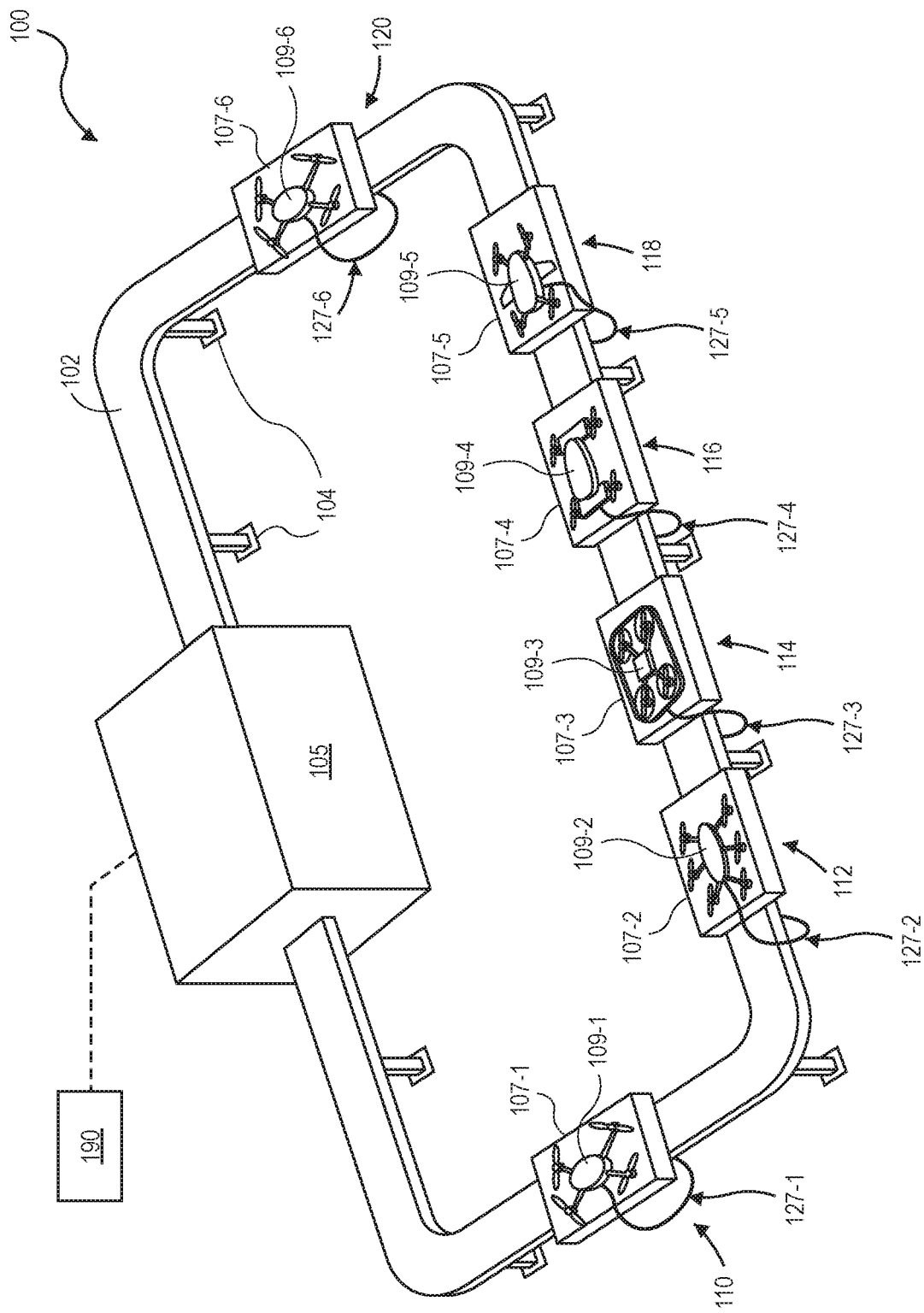
FIG. 1 is a schematic diagram of an example aerial vehicle maintenance system, in accordance with disclosed implementations.

While implementations are described herein by way of example, those skilled in the art will recognize that the implementations are not limited to the examples or drawings described. It should be understood that the drawings and detailed description thereto are not intended to limit implementations to the particular form disclosed but, on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION

Systems and methods described herein may relate to a maintenance system or line to perform maintenance for aerial vehicles. In example embodiments, the maintenance system may include a charging power source, one or more charging rails, and one or more charging cables to couple to and charge batteries of aerial vehicles during performance of other maintenance tasks.

For example, the maintenance system may include a control system and a plurality of workstations that are connected to the charging power source by one or more charging rails. In addition, aerial vehicles may couple to the one or more charging rails via one or more charging cables in order to charge respective batteries. In some example embodiments, the aerial vehicles may couple directly to the one or more charging rails via one or more charging cables. In other example embodiments, one or more platforms may move among the plurality of workstations and receive the aerial vehicles, and the aerial vehicles may couple indirectly to the one or more charging rails via one or more charging cables associated with the one or more platforms. By the use of such maintenance systems or lines, batteries of aerial vehicles may be charged in less than approximately ten minutes, while also performing other maintenance tasks during such charging.

In addition, systems and methods described herein may relate to a battery state detection system to measure or detect states of charge and/or states of health of batteries using one or more ultrasonic sensors. In example embodiments, the one or more ultrasonic sensors may emit ultrasonic waves toward one or more batteries and may receive echoes of emitted ultrasonic waves reflected back from the one or more batteries.

For example, the battery state detection system may include a control system to select one or more ultrasonic waves to emit toward batteries using ultrasonic emitters. In addition, echoes of the emitted ultrasonic waves may be received from the batteries using ultrasonic receivers to detect aspects of batteries. The detected aspects of batteries may relate to physical or mechanical characteristics of the batteries and electrochemical cells thereof, and/or chemical or material characteristics of the batteries and electrochemical cells thereof. In some example embodiments, the ultrasonic sensors may be associated with a workstation, cart, table, conveyor, platform, or other surface that is configured to receive aerial vehicles. In other example embodiments, the ultrasonic sensors may be incorporated into a portion of an aerial vehicle and configured to measure states of charge and/or states of health of one or more batteries associated with the aerial vehicle.

Further, systems and methods described herein may relate to a battery maintenance system configured to meet demand associated with a fleet of batteries while also minimizing aging and maintaining health of the fleet of batteries. In example embodiments, the battery maintenance system may include a cabinet, locker, rack, shelves, or other storage unit configured to receive and electrically connect a fleet of batteries, and also configured to adjust or modify states of charge and/or storage temperature of the fleet of batteries to meet demand and minimize aging associated with the fleet of batteries.

For example, the battery maintenance system may include a control system to adjust or modify states of charge of a fleet of batteries by discharging, charging, and/or transferring charge among the fleet of batteries. In addition, the control system may adjust or modify a storage temperature of the fleet of batteries to minimize aging and maintain health. The control system may determine desired states of charge and/or desired storage temperatures based on a plurality of factors, including but not limited to, demand data, degradation data, current states of charge data, vehicle fleet data, battery fleet data, business or financial considerations, and other factors. In some example embodiments, the battery maintenance system may include one or more cabinets or lockers configured to receive and electrically connect a fleet of batteries. In other example embodiments, the battery maintenance system may include one or more racks or shelves configured to receive a fleet of aerial vehicles and configured to electrically connect a respective fleet of batteries associated with the received fleet of aerial vehicles.

Using the systems and methods described herein, batteries (or other power sources) that may be used by aerial vehicles (or other types of vehicles, systems, machines, or devices) may be measured, maintained, charged, discharged, or otherwise managed or controlled, in order to meet demand associated with the batteries as well as to minimize aging and maintain health of the batteries.

FIG. 1 is a schematic diagram of an example aerial vehicle maintenance system 100, in accordance with disclosed implementations.

The aerial vehicle maintenance system 100 may include one or more rails 102 and one or more support members 104. For example, the one or more rails 102 may comprise various shapes, sizes, or cross-sections, e.g., circular, elliptical, rectangular, other polygonal, or irregular cross-sectional shapes, in order to allow movement of vehicles or devices, or platforms carrying vehicles or devices, along the aerial vehicle maintenance system 100. In addition, the one or more rails 102 may comprise one or more charging rails that are connected to a charging power source 105 to provide power to and charge batteries (or other power sources) associated with aerial vehicles (or other types of vehicles, systems, machines, or devices). Further, one or more platforms 107 may move along the one or more rails 102 among a plurality of workstations 110, 112, 114, 116, 118, 120 of the aerial vehicle maintenance system 100. Moreover, each platform 107 may receive an aerial vehicle 109 (or other types of vehicle, system, machine, or device) and couple the aerial vehicle 109 to a charging rail via a charging cable 127. Furthermore, a control system 190 may be in communication with the one or more rails 102, the charging power source 105, the one or more platforms 107, and one or more vehicles 109, the plurality of workstations 110, 112, 114, 116, 118, 120, and/or the one or more charging cables 127, in order to control operations and functions of the aerial vehicle maintenance system 100. Further details of the control system 190 are described herein with respect to the example shown in FIG. 12.

For example, the one or more rails 102 may form a surface, base, or area that extends among the plurality of workstations and upon which the one or more platforms 107 may move among the plurality of workstations. In some example embodiments, the one or more rails 102 may comprise one or more individual rails having various shapes, sizes, or dimensions, such as cross-sectional shapes that are circular, oval, elliptical, square, rectangular, triangular, other polygonal, or irregular shapes. In other example embodiments, the one or more rails 102 may comprise a plurality of individual rails that are combined or joined together to form a surface, base, or area upon which the one or more platforms 107 may move. Further, the one or more rails 102 may include one or more charging rails that are electrically connected to the charging power source 105 to provide power to and charge batteries (or other power sources) associated with aerial vehicles (or other types of vehicles, systems, machines, or devices). The one or more rails 102 may be formed of various materials, such as metals, plastics, composites, other materials, or combinations thereof. Further details of the one or more rails 102 are described herein with respect to the examples shown in FIGS. 2A-4B.

The one or more support members 104 may comprise support feet, legs, beams, bars, trusses, frames, or other support members to support the one or more rails 102, the one or more platforms 107, and various vehicles or devices received and moved thereon. The one or more support members 104 may be formed of various materials, such as metals, plastics, composites, other materials, or combinations thereof.

The charging power source 105 may be configured to charge batteries (or other power sources) with a relatively high power and at a relatively high rate of speed. For example, the charging power source 105 may provide power of approximately 50 kW, approximately 120 kW, approximately 350 kW, or other possible values. In addition, the charging power source 105 may provide voltage of approximately 480 Volts DC. Further, the charging power source 105 may be configured to substantially fully charge batteries (or other power sources) in less than approximately ten minutes. Example types of batteries (or other power sources) that may be charged as described herein may include lithium-ion type batteries, lithium titanate oxide (LTO) type batteries, or other types of rechargeable batteries.

The one or more platforms 107 may move along the one or more rails 102 among the plurality of workstations. For example, the one or more platforms 107 and/or the one or more rails 102 may include wheels, rollers, balls, sliding surfaces, conveyors, tracks, guides, chains, pulleys, motors, actuators, or other elements configured to facilitate movement of the one or more platforms 107 along the one or more rails 102. In some embodiments, the control system 190 may automatically, or semi-automatically, instruct or control movement of the platforms 107 among the plurality of workstations. In other embodiments, the platforms 107 may be moved at least partially manually among the plurality of workstations.

In addition, the one or more platforms 107 may be configured to receive vehicles, systems, machines, or devices, such as aerial vehicles 109. As illustrated schematically in FIG. 1, each of the aerial vehicles 109 may have a different configuration from others of the aerial vehicles. Moreover, the one or more platforms 107 may include one or more platform electrical contacts, e.g., on an underside, rear side, or lateral side of the platform, configured to electrically connect to the charging power source 105 via sliding contact with the one or more charging rails. As such, the one or more platforms 107 may maintain electrical contact via the sliding contact with the one or more charging rails while moving among the plurality of workstations of the maintenance system. In addition, the one or more platforms 107 may include integrated charging cables 127 that may be in electrical contact with the one or more platform electrical contacts, e.g., at respective first ends of the charging cables 127, such that a vehicle, system, machine, or device received by a platform 107 may establish electrical connection to the charging power source 105 via the integrated charging cables 127, e.g., at respective second ends of the charging cables 127, while moving among the plurality of workstations for performance of various maintenance tasks. In this manner, a battery of a received vehicle or device may be charged throughout the performance of various maintenance tasks while moving among the plurality of workstations of the maintenance system. The vehicles, systems, machines, or devices may include appropriate interfaces to electrically connect to and receive power via the charging cables 127.

Further, the one or more platforms 107 may be configured to move among a plurality of workstations 110, 112, 114, 116, 118, 120 of the aerial vehicle maintenance system 100. In example embodiments, the workstation 110 may be configured as an aerial vehicle receive workstation 110. For example, an aerial vehicle may navigate to and land at the aerial vehicle receive workstation 110. In addition, the aerial vehicle may power down and/or initiate other processes or functions in preparation for various maintenance tasks.

The next workstation 112 may be configured as a power test workstation 112. For example, a state of charge and/or a state of health of a battery (or other power source) of the aerial vehicle may be measured or detected. In example embodiments, the battery may be electrically connected to a charging power source 105 via a charging rail and a charging cable 127 to charge the battery for a next task or flight. In additional embodiments, the battery may be removed, replaced, charged, discharged, or otherwise maintained.

In some example embodiments, the charging of the battery via the charging power source 105 may be initiated shortly after receiving the aerial vehicle at the aerial vehicle receive workstation 110, in order to maximize the charging time of the battery. For example, the battery may be electrically connected to the charging power source 105 via the charging cable 127 at the aerial vehicle receive workstation 110, or any other workstation. In addition, other aspects or tests associated with the power test workstation 112 may be performed during later or different portions of the maintenance system.

The following workstation 114 may be configured as a data transfer workstation 114. For example, an aerial vehicle may transfer or upload data from its aerial vehicle control system to an aerial vehicle management or control system, via wired or wireless connection. The data may relate to previously performed tasks by the aerial vehicle, operational characteristics or data of the aerial vehicle, data associated with various processors, batteries, sensors, or other components of the aerial vehicle, or any other data.

The next workstation 116 may be configured as a systems test workstation 116. For example, various hardware and/or software tests may be performed on various components of the aerial vehicle, such as structural tests, motor/actuator tests, processor tests, sensor tests, software/algorithm tests, or various other tests or procedures. The tests may relate to proper function or operation of various components of the aerial vehicle, updates to functions or operations of the aerial vehicle, other checks or modifications of portions of hardware and/or software of the aerial vehicle, or any other tests or procedures.

The following workstation 118 may be configured as a task assignment workstation 118. For example, an aerial vehicle may transfer or download data from an aerial vehicle management or control system to an aerial vehicle control system, via wired or wireless connection. The data may relate to one or more tasks to be performed by the aerial vehicle, operational characteristics or data of the aerial vehicle, data associated with various processors, batteries, sensors, or other components of the aerial vehicle, or any other data related to the performance of additional tasks. Further, the aerial vehicle may receive a payload to be delivered as part of a task or flight, e.g., to a delivery destination.

Then, the next workstation 120 may be configured as an aerial vehicle launch workstation 120. For example, an aerial vehicle may power up and/or initiate various processes or functions in preparation for a task or flight. In addition, the aerial vehicle may take off from the aerial vehicle launch workstation 120 and navigate to a destination location as part of a task or flight. Further, the battery may be electrically disconnected from the charging power source 105 via the charging cable 127 at the aerial vehicle launch workstation 120, or any other workstation, prior to initiation of the task or flight. In some example embodiments, additional power tests or procedures, such as measurements related to states of charge and/or states of health, may be performed prior to initiation of the task or flight in order to ensure that the battery is sufficiently charged for the task or flight.

In further example embodiments, the order or sequence of the various workstations and associated processes described herein may be changed or modified, such that, for example, the power test workstation 112 may be integrated with the aerial vehicle receive workstation 110, in order to maximize the charging time of the battery. In still further example embodiments, the various functions and processes described herein with respect to the different workstations may be further modified, changed, combined, or re-ordered in various combinations or arrangements.

Although FIG. 1 illustrates a particular number, configuration, and arrangement of the rails, support members, and charging power source, various other numbers, configurations, and arrangements of the rails, support members, and charging power source are possible. For example, the rails may form shapes other than the rectangular shape shown in FIG. 1. In addition, the support members and rails may be formed at multiple vertical heights and/or with multiple levels, instead of at a single height as shown in FIG. 1. Further, more than one charging power source may be included in the aerial vehicle maintenance system.

Likewise, although FIG. 1 illustrates a particular number, configuration, and arrangement of platforms 107-1, 107-2, 107-3, 107-4, 107-5, 107-6, vehicles 109-1, 109-2, 109-3, 109-4, 109-5, 109-6, and workstations 110, 112, 114, 116, 118, 120, various other numbers, configurations, and arrangements of platforms, vehicles, and workstations are possible. For example, various different types, sizes, or shapes of platforms may be used together in the maintenance system, instead of only substantially similar platforms as shown in FIG. 1. In addition, various types of vehicles, systems, machines, or devices may be maintained together by the maintenance system, instead of only aerial vehicles as shown in FIG. 1. Further, various other numbers or types of workstations may be included as part of the maintenance system.

In other example embodiments, instead of having one or more rails 102 that form a surface, base, or area upon which one or more platforms 107 may move among the plurality of workstations, the one or more rails 102 may extend above, overhead, below, or underground, and one or more charging cables 127 may be electrically connected in sliding contact with one or more charging rails that extend above, overhead, below, or underground. Then, one or more carts, tables, conveyors, workstations, or other workspaces, either movable or fixed, may be associated with different portions of the one or more rails, and aerial vehicles (or other types of vehicles, systems, machines, or devices) received at such workspaces may be electrically connected to and receive power from the one or more charging rails via the one or more charging cables 127 while moving among such workspaces. In this manner, a battery of a received vehicle or device may be charged throughout the performance of various maintenance tasks while moving among the plurality of workspaces of the maintenance system. The vehicles, systems, machines, or devices may include appropriate interfaces to electrically connect to and receive power via the charging cables 127.

FIGS. 2A and 2B are schematic diagrams of a first example rail 202 of an example aerial vehicle maintenance system, in accordance with disclosed implementations. FIG. 2A is a schematic, partial perspective view of the first example rail 202, and FIG. 2B is a schematic, cross-sectional view of the first example rail 202, taken along lines B-B' shown in FIG. 2A.

As described with respect to FIG. 1, the one or more rails 102 of the aerial vehicle maintenance system 100 may include a charging rail 202. The charging rail 202 may include an outer, insulating support member that may have a C-shaped cross-section, as shown in FIGS. 2A and 2B. In addition, the outer, insulating support member may be configured to at least partially house or encompass various electrically conductive lines, wires, elements, or components used to provide power to charge batteries, such that the charging rail 202 may be generally safe to contact by humans while providing power for charging. The outer, insulating support member may be formed of various insulating, or non-electrically conductive materials, such as plastics, glass, rubber, wood, or other non-electrically conductive materials.

As shown in FIGS. 2A and 2B, one or more electrical contacts or magnetic strips 222 may extend along the length of an interior of the charging rail 202, and the one or more electrical contacts 222 may couple to a charging power source and provide power to various elements or components coupled therewith. In some example embodiments, the electrical contacts 222 may be coupled to a positive polarity associated with the charging power source, and a second charging rail substantially similar to that shown in FIGS. 2A and 2B may include electrical contacts that are coupled to a negative polarity associated with the charging power source. In other example embodiments, the polarities may be reversed, and/or various other configurations, such as two-phase, three-phase, or other configurations, may be possible such that power is provided to charge batteries via the electrical contacts 222. Further, the electrical contacts 222 may be formed of various electrically conductive materials, such as copper, aluminum, silver, iron, steel, or other metals.

Within the charging rail 202, a first end 225 of a charging cable 227 may be in sliding contact with the one or more electrical contacts 222 to provide power, via the charging cable 227, to a vehicle, machine, system, or device coupled to a second, opposite end (not shown) of the charging cable 227. In order to facilitate the sliding contact, the first end 225 of the charging cable 227 may be formed as a sphere, cylinder, or other polygonal shape that may slide along the interior of the charging rail 202 while maintaining contact with the electrical contacts 222. In other example embodiments, the first end 225 of the charging cable 227 may include sliding or smooth surfaces, lubricants, brushes, bearings, rollers, wheels, or other elements or materials configured to enable sliding contact between the first end 225 of the charging cable 227 and the one or more electrical contacts 222. In addition, the electrical contacts 222 may also exhibit flexibility, bias, and/or resilience in order to maintain sliding, electrical contact with the first end 225 of the charging cable 227.

In this manner, power may be provided from a charging power source via the charging rail 202 and one or more charging cables 227 to charge one or more batteries associated vehicles, machines, systems, or devices. In some example embodiments, the charging rail 202 may be positioned above, overhead, below, or underground, and one or more vehicles or devices may couple directly to the charging rail 202 via one or more charging cables 227.

In other example embodiments, the charging rail 202 may, potentially in combination with one or more other rails, form a surface, base, or area upon which one or more platforms may move, and a portion of the platforms, such as an underside, rear side, or lateral side, may include platform electrical contacts that interface with the electrical contacts 222 within the interior of the charging rail 202. In such examples, the platform electrical contacts may be configured substantially similar to the first end 225 and the charging cable 227. Alternatively, the platform electrical contacts may be incorporated into other structural or rigid components of the platforms that facilitate movement or sliding of the platforms along the rails, such as another C-shaped, platform electrical contact that at least partially surrounds the charging rail 202 and includes a sliding electrical contact similar to the first end 225, as shown in FIG. 2B, that interfaces with the electrical contacts 222 within the interior of the charging rail 202. Such structural or rigid components of platforms that incorporate platform electrical contacts to a charging rail 202 may improve safety by reducing the presence or length of wires or cables extending between the charging rail 202 and a coupled vehicle or device. Further, the platforms may incorporate additional, shorter charging cables 227 coupled to the platform electrical contacts, e.g., at a first end, to which one or more vehicles, machines, systems, or devices may be coupled, e.g., at a second end, to charge associated batteries.

Figure 3B:
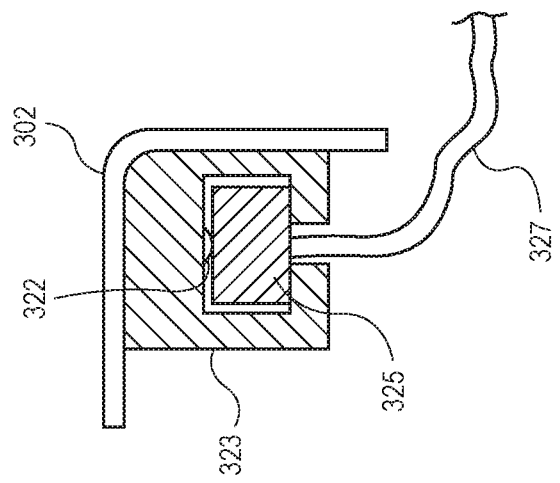
FIGS. 3A and 3B are schematic diagrams of a second example rail of an example aerial vehicle maintenance system, in accordance with disclosed implementations.
Figure 3A:
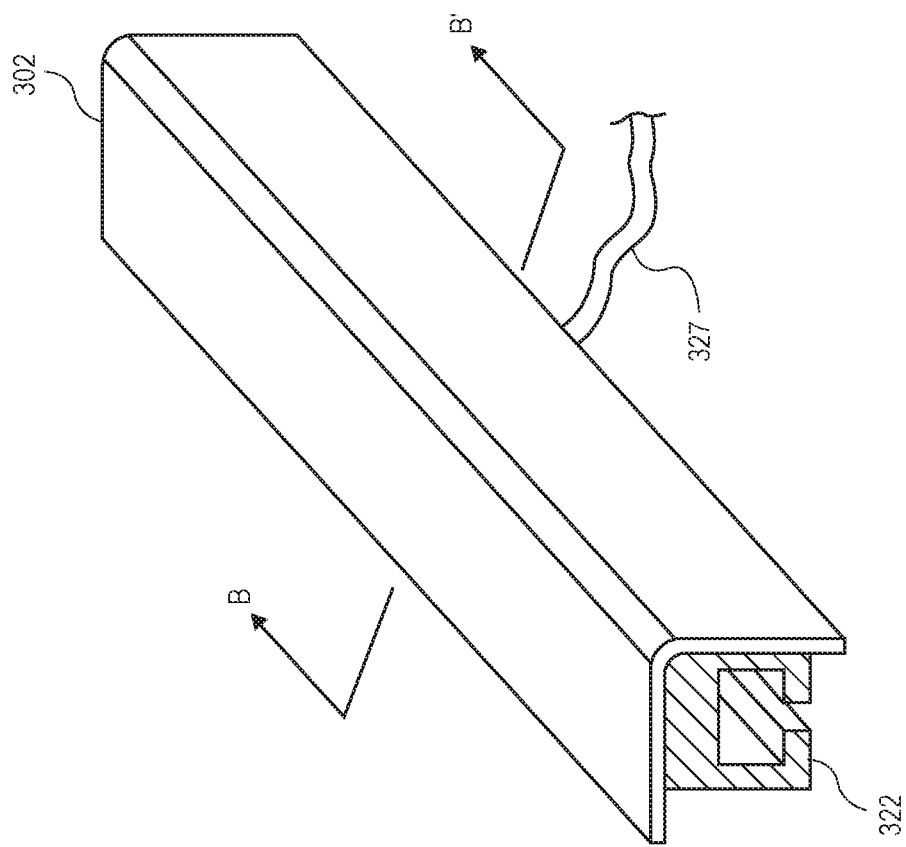

FIGS. 3A and 3B are schematic diagrams of a second example rail 302 of an example aerial vehicle maintenance system, in accordance with disclosed implementations. FIG. 3A is a schematic, partial perspective view of the second example rail 302, and FIG. 3B is a schematic, cross-sectional view of the second example rail 302, taken along lines B-B' shown in FIG. 3A.

As described with respect to FIG. 1, the one or more rails 102 of the aerial vehicle maintenance system 100 may include a charging rail 302. The charging rail 302 may include an outer, insulating support member that may have an L-shaped cross-section, as shown in FIGS. 3A and 3B. In addition, the outer, insulating support member may be configured to at least partially house or encompass various electrically conductive lines, wires, elements, or components used to provide power to charge batteries, such that the charging rail 302 may be generally safe to contact by humans while providing power for charging. The outer, insulating support member may be formed of various insulating, or non-electrically conductive materials, such as plastics, glass, rubber, wood, or other non-electrically conductive materials.

As shown in FIGS. 3A and 3B, one or more conductive portions 323 and one or more electrical contacts 322 may extend along the length of an underside, rear side, or other generally inaccessible portion of the charging rail 302, and the one or more conductive portions 323 and one or more electrical contacts 322 may couple to a charging power source and provide power to various elements or components coupled therewith. In some example embodiments, the conductive portions 323 and electrical contacts 322 may be coupled to a positive polarity associated with the charging power source, and a second charging rail substantially similar to that shown in FIGS. 3A and 3B may include conductive portions and electrical contacts that are coupled to a negative polarity associated with the charging power source. In other example embodiments, the polarities may be reversed, and/or various other configurations, such as two-phase, three-phase, or other configurations, may be possible such that power is provided to charge batteries via the conductive portions 323 and electrical contacts 322. Further, the conductive portions 323 and electrical contacts 322 may be formed of various electrically conductive materials, such as copper, aluminum, silver, iron, steel, or other metals.

Within the charging rail 302, a first end 325 of a charging cable 327 may be in sliding contact with the one or more conductive portions 323 and electrical contacts 322 to provide power, via the charging cable 327, to a vehicle, machine, system, or device coupled to a second, opposite end (not shown) of the charging cable 327. In order to facilitate the sliding contact, the first end 325 of the charging cable 327 may be formed as a cube, prism, block, or other polygonal shape that may slide along the underside, rear side, or other generally inaccessible portion of the charging rail 302 while maintaining contact with the conductive portions 323 and electrical contacts 322. In other example embodiments, the first end 325 of the charging cable 327 may include sliding or smooth surfaces, lubricants, brushes, bearings, rollers, wheels, or other elements or materials configured to enable sliding contact between the first end 325 of the charging cable 327 and the one or more conductive portions 323 and electrical contacts 322. In addition, the electrical contacts 322 may also exhibit flexibility, bias, and/or resilience in order to maintain sliding, electrical contact with the first end 325 of the charging cable 327.

In this manner, power may be provided from a charging power source via the charging rail 302 and one or more charging cables 327 to charge one or more batteries associated vehicles, machines, systems, or devices. In some example embodiments, the charging rail 302 may be positioned above, overhead, below, or underground, and one or more vehicles or devices may couple directly to the charging rail 302 via one or more charging cables 327.

In other example embodiments, the charging rail 302 may, potentially in combination with one or more other rails, form a surface, base, or area upon which one or more platforms may move, and a portion of the platforms, such as an underside, rear side, or lateral side, may include platform electrical contacts that interface with the conductive portions 323 and electrical contacts 322 along the underside, rear side, or other generally inaccessible portion of the charging rail 302. In such examples, the platform electrical contacts may be configured substantially similar to the first end 325 and the charging cable 327. Alternatively, the platform electrical contacts may be incorporated into other structural or rigid components of the platforms that facilitate movement or sliding of the platforms along the rails, such as another L-shaped, platform electrical contact that at least partially surrounds the charging rail 302 and includes a sliding electrical contact similar to the first end 325, as shown in FIG. 3B, that interfaces with the conductive portions 323 and electrical contacts 322 along the underside, rear side, or other generally inaccessible portion of the charging rail 302. Such structural or rigid components of platforms that incorporate platform electrical contacts to a charging rail 302 may improve safety by reducing the presence or length of wires or cables extending between the charging rail 302 and a coupled vehicle or device. Further, the platforms may incorporate additional, shorter charging cables 327 coupled to the platform electrical contacts, e.g., at a first end, to which one or more vehicles, machines, systems, or devices may be coupled, e.g., at a second end, to charge associated batteries.

Figure 4B:
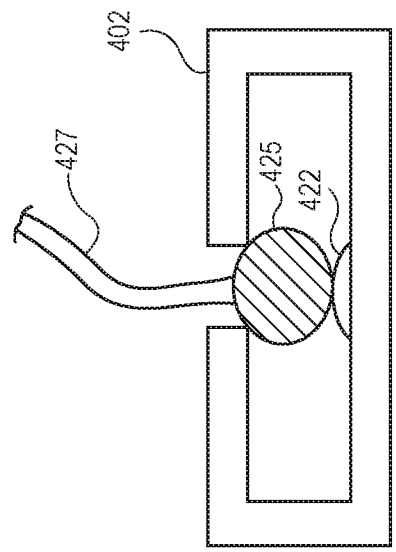
FIGS. 4A and 4B are schematic diagrams of a third example rail of an example aerial vehicle maintenance system, in accordance with disclosed implementations.
Figure 4A:
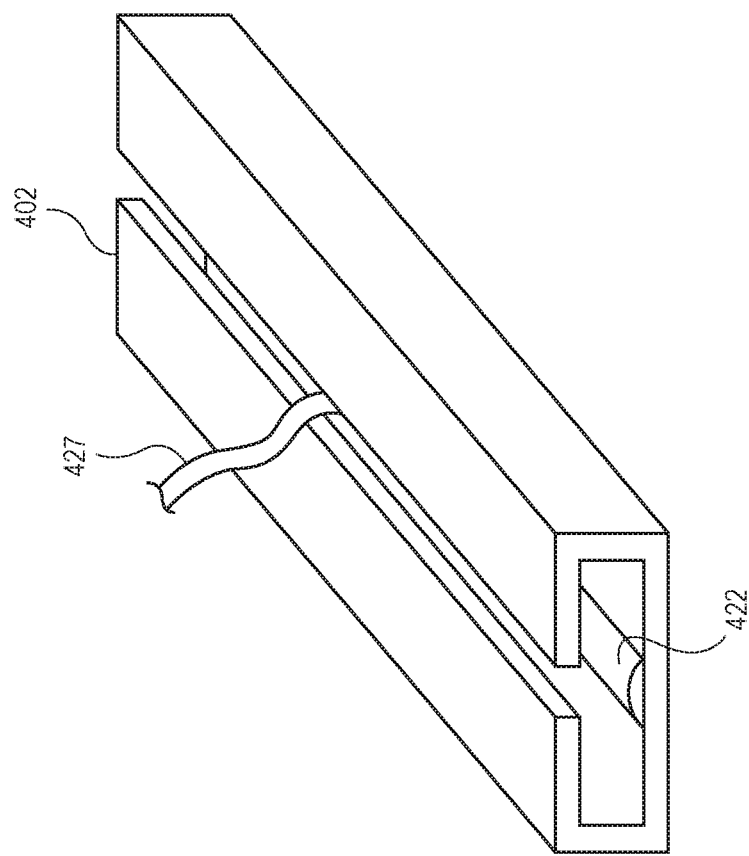

FIGS. 4A and 4B are schematic diagrams of a third example rail 402 of an example aerial vehicle maintenance system, in accordance with disclosed implementations. FIG. 4A is a schematic, partial perspective view of the third example rail 402, and FIG. 4B is a schematic, cross-sectional view of the third example rail 402, taken along lines B-B' shown in FIG. 4A.

As described with respect to FIG. 1, the one or more rails 102 of the aerial vehicle maintenance system 100 may include a charging rail 402. The charging rail 402 may include an outer, insulating support member that may have a rectangular-shaped cross-section, as shown in FIGS. 4A and 4B. In addition, the outer, insulating support member may be configured to at least partially house or encompass various electrically conductive lines, wires, elements, or components used to provide power to charge batteries, such that the charging rail 402 may be generally safe to contact by humans while providing power for charging. The outer, insulating support member may be formed of various insulating, or non-electrically conductive materials, such as plastics, glass, rubber, wood, or other non-electrically conductive materials.

As shown in FIGS. 4A and 4B, one or more electrical contacts or magnetic strips 422 may extend along the length of an interior of the charging rail 402, and the one or more electrical contacts 422 may couple to a charging power source and provide power to various elements or components coupled therewith. In some example embodiments, the electrical contacts 422 may be coupled to a positive polarity associated with the charging power source, and a second charging rail substantially similar to that shown in FIGS. 4A and 4B may include electrical contacts that are coupled to a negative polarity associated with the charging power source. In other example embodiments, the polarities may be reversed, and/or various other configurations, such as two-phase, three-phase, or other configurations, may be possible such that power is provided to charge batteries via the electrical contacts 422. Further, the electrical contacts 422 may be formed of various electrically conductive materials, such as copper, aluminum, silver, iron, steel, or other metals.

Within the charging rail 402, a first end 425 of a charging cable 427 may be in sliding contact with the one or more electrical contacts 422 to provide power, via the charging cable 427, to a vehicle, machine, system, or device coupled to a second, opposite end (not shown) of the charging cable 427. In order to facilitate the sliding contact, the first end 425 of the charging cable 427 may be formed as a sphere, cylinder, or other polygonal shape that may slide along the interior of the charging rail 402 while maintaining contact with the electrical contacts 422. In other example embodiments, the first end 425 of the charging cable 427 may include sliding or smooth surfaces, lubricants, brushes, bearings, rollers, wheels, or other elements or materials configured to enable sliding contact between the first end 425 of the charging cable 427 and the one or more electrical contacts 422. In addition, the electrical contacts 422 may also exhibit flexibility, bias, and/or resilience in order to maintain sliding, electrical contact with the first end 425 of the charging cable 427.

In this manner, power may be provided from a charging power source via the charging rail 402 and one or more charging cables 427 to charge one or more batteries associated vehicles, machines, systems, or devices. In some example embodiments, the charging rail 402 may be positioned above, overhead, below, or underground, and one or more vehicles or devices may couple directly to the charging rail 402 via one or more charging cables 427.

In other example embodiments, the charging rail 402 may, potentially in combination with one or more other rails, form a surface, base, or area upon which one or more platforms may move, and a portion of the platforms, such as an underside, rear side, or lateral side, may include platform electrical contacts that interface with the electrical contacts 422 within the interior of the charging rail 402. In such examples, the platform electrical contacts may be configured substantially similar to the first end 425 and the charging cable 427. Alternatively, the platform electrical contacts may be incorporated into other structural or rigid components of the platforms that facilitate movement or sliding of the platforms along the rails, such as another rectangular-shaped, or U-shaped, platform electrical contact that at least partially surrounds the charging rail 402 and includes a sliding electrical contact similar to the first end 425, as shown in FIG. 4B, that interfaces with the electrical contacts 422 within the interior of the charging rail 402. Such structural or rigid components of platforms that incorporate platform electrical contacts to a charging rail 402 may improve safety by reducing the presence or length of wires or cables extending between the charging rail 402 and a coupled vehicle or device. Further, the platforms may incorporate additional, shorter charging cables 427 coupled to the platform electrical contacts, e.g., at a first end, to which one or more vehicles, machines, systems, or devices may be coupled, e.g., at a second end, to charge associated batteries.

Although FIGS. 2A-4B illustrate particular numbers, configurations, and arrangements of charging rails and associated components, various other numbers, configurations, and arrangements of charging rails and associated components may be possible. For example, the charging rails may have various other shapes or sizes, such as oval, elliptical, other polygonal, or irregular shapes. In addition, the number, size, shape, type, position, and other characteristics of electrical contacts and/or first ends of charging cables may also have other numbers, sizes, shapes, positions, types, or other characteristics.

Figure 5:
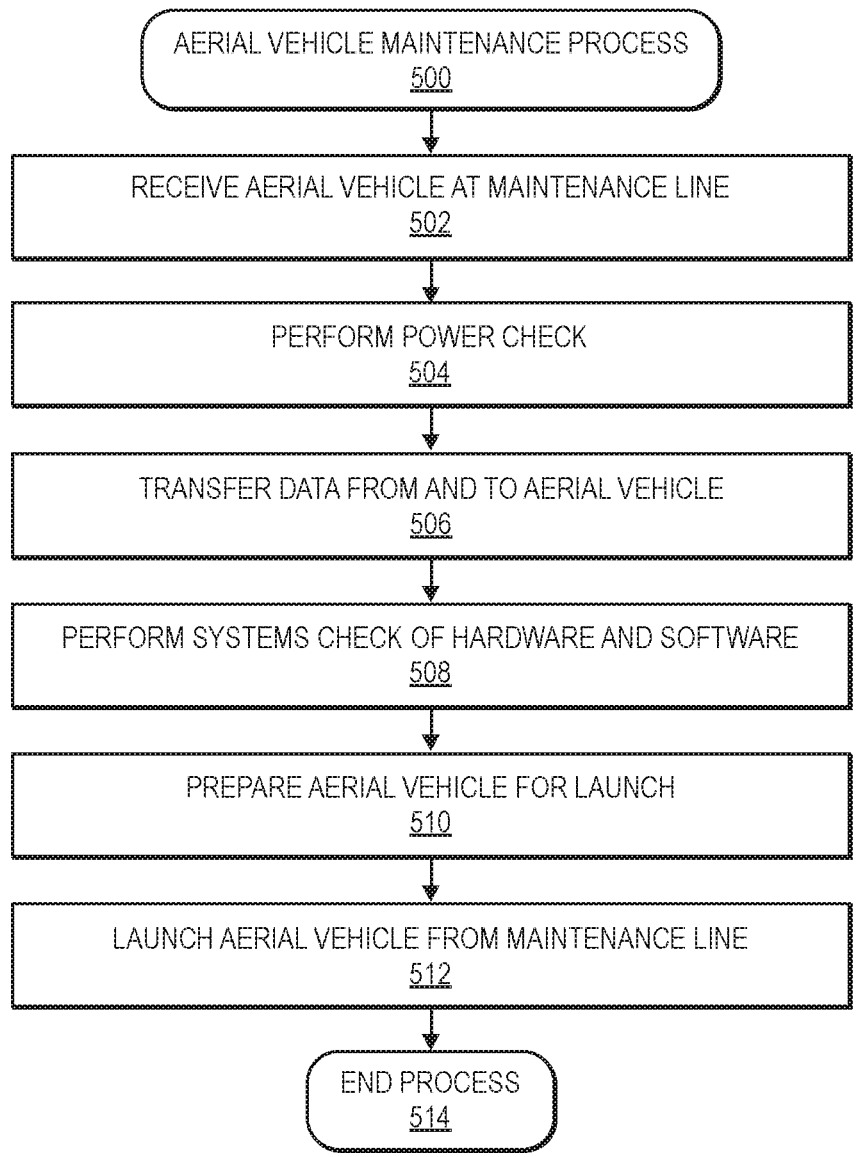
FIG. 5 is a flow diagram illustrating an example aerial vehicle maintenance process, in accordance with disclosed implementations.

FIG. 5 is a flow diagram illustrating an example aerial vehicle maintenance process 500, in accordance with disclosed implementations.

The process 500 may begin by receiving an aerial vehicle at a maintenance line or system, as at 502. For example, a control system may instruct or command an aerial vehicle to navigate to and land at an aerial vehicle receive workstation of a maintenance system. In addition, the control system may instruct the aerial vehicle to power down and/or initiate other processes or functions in preparation for various maintenance tasks.

The process 500 may proceed by performing a power or power supply test, as at 504. For example, a control system may instruct a state of charge and/or a state of health of a battery (or other power source) of the aerial vehicle to be measured or detected at a power test workstation of a maintenance system. In example embodiments, the control system may instruct the battery to be electrically connected to a charging power source via a charging rail and a charging cable to charge the battery for a next task or flight. In additional embodiments, the control system may instruct the battery to be removed, replaced, charged, discharged, or otherwise maintained.

In some example embodiments, the charging of the battery via the charging power source may be initiated shortly after receiving the aerial vehicle at the aerial vehicle receive workstation, in order to maximize the charging time of the battery. For example, the control system may instruct the battery to be electrically connected to the charging power source via the charging cable at the aerial vehicle receive workstation, or any other workstation. In addition, the control system may instruct other aspects or tests associated with the power test workstation to be performed during later or different portions of the maintenance system.

The process 500 may then continue to transfer data from and/or to the aerial vehicle, as at 506. For example, the control system may instruct an aerial vehicle to transfer or upload data from its aerial vehicle control system to an aerial vehicle management system or the control system, via wired or wireless connection, at a data transfer workstation of a maintenance system. The data may relate to previously performed tasks by the aerial vehicle, operational characteristics or data of the aerial vehicle, data associated with various processors, batteries, sensors, or other components of the aerial vehicle, or any other data.

The process 500 may then proceed with performing a systems check of hardware and/or software, as at 508. For example, the control system may instruct various hardware and/or software tests to be performed on various components of the aerial vehicle, such as structural tests, motor/actuator tests, processor tests, sensor tests, software/algorithm tests, or various other tests or procedures at a systems test workstation of a maintenance system. The tests may relate to proper function or operation of various components of the aerial vehicle, updates to functions or operations of the aerial vehicle, other checks or modifications of portions of hardware and/or software of the aerial vehicle, or other tests or procedures.

The process 500 may then continue with preparing the aerial vehicle for launch, as at 510. For example, the control system may instruct an aerial vehicle to transfer or download data from an aerial vehicle management system or the control system to an aerial vehicle control system, via wired or wireless connection, at a task assignment workstation of a maintenance system. The data may relate to one or more tasks to be performed by the aerial vehicle, operational characteristics or data of the aerial vehicle, data associated with various processors, batteries, sensors, or other components of the aerial vehicle, or any other data related to the performance of additional tasks. Further, the control system may instruct a payload to be loaded into the aerial vehicle to be delivered as part of a task or flight, e.g., to a delivery destination. In addition, the control system may instruct the battery of the aerial vehicle to be disconnected from the charging power source via the charging cable and charging rail in preparation for launch. In some example embodiments, additional power tests or procedures, such as measurements related to states of charge and/or states of health, may be performed prior to disconnection from the charging power source in order to ensure that the battery is sufficiently charged for the task or flight.

Then, the process 500 may proceed to launch the aerial vehicle from the maintenance line or system, as at 512. For example, the control system may instruct or command an aerial vehicle to power up and/or initiate various processes or functions in preparation for a task or flight at an aerial vehicle launch workstation of a maintenance system. In addition, the control system may instruct the aerial vehicle to take off from the aerial vehicle launch workstation and navigate to a destination location as part of a task or flight. Further, the control system may instruct the battery of the aerial vehicle to be disconnected from the charging power source via the charging cable and charging rail just prior to launch, in order to maximize the charging time of the battery. In some example embodiments, additional power tests or procedures, such as measurements related to states of charge and/or states of health, may be performed prior to initiation of the task or flight in order to ensure that the battery is sufficiently charged for the task or flight. The process 500 may then end, as at 514.

By the process 500 described above and the systems described herein including a charging power source, one or more charging rails, and one or more charging cables (with or without associated platforms) in sliding contact with the charging rails, batteries (or other power sources) of aerial vehicles (or other vehicles, machines, systems, or devices) may be charged while the vehicles or devices are moved among a plurality of workstations or workspaces for performance of various maintenance tasks. In addition, the electrically conductive portions of the charging rails may be insulated or protected from contact by humans to maintain operator safety. Accordingly, safe and efficient charging of batteries of vehicles, systems, machines, or devices may be accomplished in relatively short periods of time, e.g., less than approximately ten minutes, and during the performance of various other maintenance tasks associated with such vehicles, systems, machines, or devices.

Figure 6A:
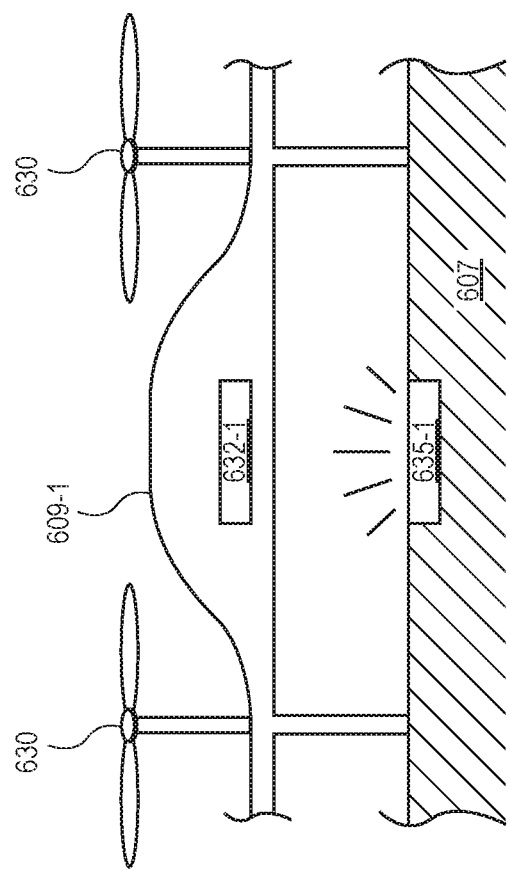
FIGS. 6A and 6B are schematic diagrams of example ultrasonic battery state detection systems, in accordance with disclosed implementations.
Figure 6B:
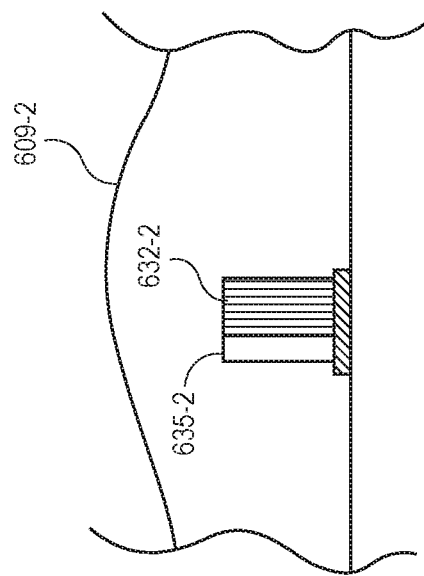

FIGS. 6A and 6B are schematic diagrams of example ultrasonic battery state detection systems, in accordance with disclosed implementations.

With the use of ultrasonic sensors, transducers, emitters, and/or receivers, states of charge and/or states of health of electrochemical cells of batteries may be detected or measured without detrimentally affecting, degrading, and/or discharging one or more electrochemical cells of the batteries during the measurement process. Moreover, various properties of ultrasonic waves may be tuned to determine particular characteristics of electrochemical cells, such as physical, mechanical, chemical, and/or material characteristics, in order to more precisely make determinations as to states of charge and/or states of health of one or more electrochemical cells of the batteries.

Figure 11:
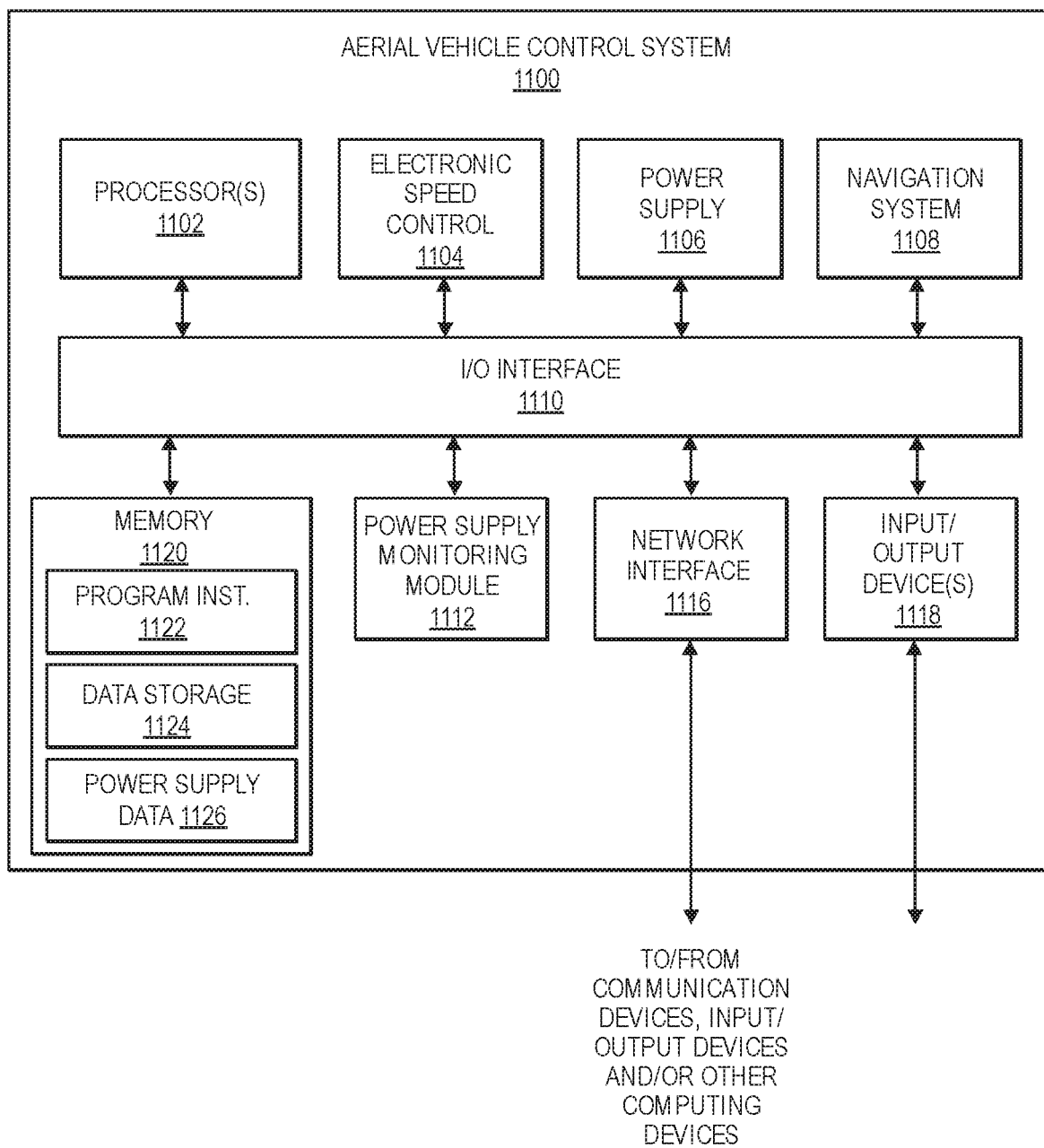
FIG. 11 is a block diagram illustrating various components of an aerial vehicle control system, in accordance with disclosed implementations.

FIG. 6A illustrates a portion of an example aerial vehicle 609-1 having a plurality of propulsion mechanisms 630, a power supply or battery 632-1, and an aerial vehicle control system (not shown), as further described herein with respect to FIG. 11. The aerial vehicle 609-1 may be any type or configuration of aerial vehicle, and may include additional components not described herein, including various processors, controllers, motors, actuators, propellers, sensors, or other components. In addition, the battery 632-1 may comprise lithium-ion type batteries, lithium titanate oxide (LTO) type batteries, or other types of rechargeable batteries.

As shown in FIG. 6A, the aerial vehicle 609-1 may have landed or otherwise be positioned on a surface, such as a platform 607. In other example embodiments, the surface may be part of a cart, table, workstation, conveyor, or other portion of a workspace, either movable or fixed. In addition, the surface may include an ultrasonic sensor 635-1 configured to emit ultrasonic waves and receive echoes of emitted ultrasonic waves that are reflected back. In example embodiments, the ultrasonic sensor 635-1 may comprise both an ultrasonic emitter and an ultrasonic receiver. In other example embodiments, the ultrasonic sensor 635-1 may comprise two separate or distinct components, e.g., an emitter and a receiver. Further, the aerial vehicle 609-1 or portions thereof, such as an aerial vehicle control system, and the ultrasonic sensor 635-1 may be in communication with a control system, as further described herein with respect to FIG. 12.

The control system may instruct the ultrasonic sensor 635-1 to emit ultrasonic waves toward a battery 632-1 of the aerial vehicle 609-1. In addition, the control system may instruct the ultrasonic sensor 635-1 to receive echoes of emitted ultrasonic waves from a battery 632-1 of the aerial vehicle 609-1. In example embodiments, the control system may select various properties of ultrasonic waves to be emitted, such as frequency, wavelength, amplitude, phase, duration, or other properties. The various properties may be selected in order to detect one or more characteristics associated with the battery 632-1, such as physical or mechanical characteristics, and/or chemical or material characteristics. For example, the physical or mechanical characteristics may include changes to surfaces, sizes, shapes, thicknesses, or other physical characteristics associated with one or more electrochemical cells of batteries. In addition, the chemical or material characteristics may include changes to chemical or material composition, generation of void fractions, phase changes, or other chemical characteristics associated with one or more electrochemical cells of batteries.

Various machine learning techniques or algorithms may be developed, trained, and utilized to determine correlations between data associated with various properties of emitted ultrasonic waves, echoes of ultrasonic waves, and/or changes therebetween, and data associated with various changes to physical or mechanical characteristics, and/or chemical or material characteristics. In addition, various machine learning techniques or algorithms may be developed, trained, and utilized to determine correlations between data associated with various changes to physical or mechanical characteristics, and/or chemical or material characteristics, and data associated with states of charge and/or states of health of electrochemical cells of batteries.

The control system may further receive and process data associated with emitted ultrasonic waves and received echoes of ultrasonic waves to determine changes to various properties between the emitted waves and received echoes. Then, based at least in part on the determined changes to various properties, and potentially with the use of one or more trained machine learning techniques or algorithms, various changes to physical or mechanical characteristics, and/or chemical or material characteristics, associated with the battery may be determined. Further, based at least in part on the determined changes to physical or mechanical characteristics, and/or chemical or material characteristics, and potentially with the use of one or more trained machine learning techniques or algorithms, a state of charge and/or a state of health of a battery may be determined.

FIG. 6B illustrates a portion of an example aerial vehicle 609-2 having a plurality of propulsion mechanisms (not shown), a power supply or battery 632-2, and an aerial vehicle control system (not shown), as further described herein with respect to FIG. 11. The aerial vehicle 609-2 may be any type or configuration of aerial vehicle, and may include additional components not described herein, including various processors, controllers, motors, actuators, propellers, sensors, or other components. In addition, the battery 632-2 may comprise lithium-ion type batteries, lithium titanate oxide (LTO) type batteries, or other types of rechargeable batteries.

As shown in FIG. 6B, the aerial vehicle 609-2 may be in airborne operation or flight, or may have landed or otherwise be positioned on a surface, such as a ground, street, rooftop, cart, table, workstation, conveyor, or other portion of a workspace, either movable or fixed. In addition, the aerial vehicle 609-2 may include an integral ultrasonic sensor 635-2 configured to emit ultrasonic waves and receive echoes of emitted ultrasonic waves that are reflected back. In example embodiments, the integral ultrasonic sensor 635-2 may be positioned or located such that it is in contact with at least a portion of the battery 632-2, as shown in FIG. 6B, while in other example embodiments, the integral ultrasonic sensor 635-2 may be positioned or located such that it is at a known distance from at least a portion of the battery 632-2. By integration of the ultrasonic sensor 635-2 as part of the aerial vehicle 609-2, a state of the battery 632-2 may be measured or detected by the ultrasonic sensor 635-2 substantially continuously, periodically, or at any desired time, and during any mode of operation of the aerial vehicle 609-2, whether airborne, hovering, in transit, ascending, descending, landed, stationary, grounded, or otherwise. In example embodiments, the ultrasonic sensor 635-2 may comprise both an ultrasonic emitter and an ultrasonic receiver. In other example embodiments, the ultrasonic sensor 635-2 may comprise two separate or distinct components, e.g., an emitter and a receiver. Further, the aerial vehicle 609-2 or portions thereof, such as an aerial vehicle control system, and the ultrasonic sensor 635-2 may be in communication with a control system, as further described herein with respect to FIG. 12.

The aerial vehicle control system or the control system may instruct the ultrasonic sensor 635-2 to emit ultrasonic waves toward a battery 632-2 of the aerial vehicle 609-2. In addition, the aerial vehicle control system or the control system may instruct the ultrasonic sensor 635-2 to receive echoes of emitted ultrasonic waves from a battery 632-2 of the aerial vehicle 609-2. In example embodiments, the aerial vehicle control system or the control system may select various properties of ultrasonic waves to be emitted, such as frequency, wavelength, amplitude, phase, duration, or other properties. The various properties may be selected in order to detect one or more characteristics associated with the battery 632-2, such as physical or mechanical characteristics, and/or chemical or material characteristics. For example, the physical or mechanical characteristics may include changes to surfaces, sizes, shapes, thicknesses, or other physical characteristics associated with one or more electrochemical cells of batteries. In addition, the chemical or material characteristics may include changes to chemical or material composition, generation of void fractions, phase changes, or other chemical characteristics associated with one or more electrochemical cells of batteries.

Various machine learning techniques or algorithms may be developed, trained, and utilized to determine correlations between data associated with various properties of emitted ultrasonic waves, echoes of ultrasonic waves, and/or changes therebetween, and data associated with various changes to physical or mechanical characteristics, and/or chemical or material characteristics. In addition, various machine learning techniques or algorithms may be developed, trained, and utilized to determine correlations between data associated with various changes to physical or mechanical characteristics, and/or chemical or material characteristics, and data associated with states of charge and/or states of health of electrochemical cells of batteries.

The aerial vehicle control system or the control system may further receive and process data associated with emitted ultrasonic waves and received echoes of ultrasonic waves to determine changes to various properties between the emitted waves and received echoes. Then, based at least in part on the determined changes to various properties, and potentially with the use of one or more trained machine learning techniques or algorithms, various changes to physical or mechanical characteristics, and/or chemical or material characteristics, associated with the battery may be determined. Further, based at least in part on the determined changes to physical or mechanical characteristics, and/or chemical or material characteristics, and potentially with the use of one or more trained machine learning techniques or algorithms, a state of charge and/or a state of health of a battery may be determined.

Although FIGS. 6A and 6B show a particular number, configuration, and arrangement of an aerial vehicle, platform, battery, and ultrasonic sensor, various other numbers, configurations, and arrangements of aerial vehicles, platforms or surfaces, batteries, and ultrasonic sensors may be used to measure or detect states of charge and/or states of health of electrochemical cells of batteries.

In example embodiments, a battery as described herein may be comprise one or more electrochemical cells, e.g., thirty to fifty cells. Although only three cells are shown in the examples of FIGS. 7A and 7B, any other number, shape, or size of cells may be included in a battery. Each electrochemical cell may be composed of a positive electrode or cathode layer, a negative electrode or anode layer, and a separation layer therebetween. The cathode and anode layers may comprise cathode and anode foils, respectively. The separation layer may include a conductive electrolyte containing cations, i.e., positively charged ions, and anions, i.e., negatively charged ions. Generally, during charging of a battery, cations may be reduced at the cathode layer by adding electrons, and anions may be oxidized at the anode layer by removing electrons, and during discharging of the battery, the flow of electrons may be reversed. However, in other embodiments, the processes described herein for charging and discharging a battery may be reversed.

In some embodiments, the battery may be a lithium-ion type or lithium titanate oxide type battery having one or more electrochemical cells that exhibit intercalation. Intercalation describes a substantially reversible process by which ions move in and out of the crystal or lattice structure of layers of the battery during charging and/or discharging. As an example, ions may move into the crystal or lattice structure of the cathode and/or anode layers during charging, and ions may move out of the crystal or lattice structure of the cathode and/or anode layers during discharging, or vice versa. In other embodiments, the battery may be any other type or class of battery that exhibits intercalation.

In some embodiments, the electrochemical cells may be stacked in a prismatic configuration, e.g., rectangular or cubic, such that successive layers of cathode and anode layers are stacked on top of each other. The stacked electrochemical cells may be held together within a flexible or compliant casing, e.g., a polymer pouch, a flexible casing, or other compliant housing, that allows the electrochemical cells to experience dimensional changes during operation. In example embodiments, for a battery composed of stacked electrochemical cells in a prismatic configuration, the dimensional change may be anisotropic and occur along a direction that is substantially perpendicular to the planes of the cathode and anode layers stacked on top of each other. The dimensional changes may come about as a result of intercalation within each cell during charging and/or discharging. For example, during charging, intercalation may cause ions to be added to the cathode layer and/or the anode layer, thereby causing a dimensional change, e.g., an increase in physical dimension, of the electrochemical cells. Likewise, during discharging, intercalation may cause ions to be removed from the cathode layer and/or the anode layer, thereby causing a dimensional change, e.g., a decrease in physical dimension, of the electrochemical cells. In other embodiments, the dimensional changes caused by intercalation may be reversed, e.g., a decrease in physical dimension during charging and/or an increase in physical dimension during discharging.

In addition, one or more cells of the battery may be associated with respective walls, surfaces, peripheries, or boundaries that may reflect ultrasonic waves having various properties that may be emitted by an ultrasonic sensor, in which the reflected ultrasonic waves or echoes may exhibit one or more recognizable properties, aspects, or changes relative to the emitted ultrasonic waves. Further, one or more cells of the battery may be associated with respective chemicals or materials that may also reflect ultrasonic waves having various properties that may be emitted by an ultrasonic sensor, in which the reflected ultrasonic waves or echoes may also exhibit one or more recognizable properties, aspects, or changes relative to the emitted ultrasonic waves.

In other example embodiments, a battery as described herein may comprise other types of power sources, such as supercapacitors or other types, configurations, or chemistries of batteries, electrochemical cells, electrochemical storage devices, power supplies, or other power sources that may be used with one or more portions of the present disclosure.

A state of charge of an electrochemical cell of a battery may generally refer to a level of charge, e.g., between 0% (no charge) and 100% (full charge), for the electrochemical cell. In some embodiments, a state of charge of an electrochemical cell may be determined from a determined dimension of the cell, e.g., by at least referencing a known dimension of the cell at a known state of charge. In addition, a state of charge of the electrochemical call may be determined from a change in dimension of the cell over time, e.g., by at least referencing a known rate of change in dimension of the cell over time. For example, a dimensional change of approximately 2-3% of the overall dimension of a power supply (or individual cells of the power supply) may be observed between a full state of charge and a zero state of charge. In addition, the dimensional change may increase or decrease approximately linearly with the state of charge. In some embodiments, a power supply may exhibit greater or lesser than approximately 2-3% dimensional change to an overall dimension of a power supply (or individual cells of the power supply).

A state of health of an electrochemical cell may generally refer to a condition of the cell relative to its ideal specifications, e.g., between 0% (does not meet any of its ideal specifications) and 100% (fully meets all of its ideal specifications). The state of health may include one or more parameters such as capacity, resistance, impedance, conductance, voltage, and others. In some embodiments, a state of health of the electrochemical cell may be determined from a comparison between the changes in dimension of the cell over time and respective changes in dimension of other similar cells over time and/or known changes in dimension of other similar cells having ideal specifications. For example, a cell that exhibits greater changes in physical dimension during charging and/or discharging relative to respective changes in physical dimension of other similar cells may be determined to have a lower state of health, e.g., a reduced capacity. In addition, a state of health of the electrochemical cell may also be determined from a determination of chemical or material composition changes or void fractions associated with the electrochemical cell. For example, one or more materials of an electrochemical cell may degrade over time and/or as a result of use, such that one or more chemical or material composition changes may occur within the electrochemical cell, and/or one or more void fractions may be generated within the electrochemical cell, thereby reducing the state of health of the electrochemical cell.

FIGS. 7A and 7B are schematic, close-up diagrams of example ultrasonic battery state detection systems, in accordance with disclosed implementations.

As shown in FIG. 7A, a battery 732-1 may include a plurality of electrochemical cells, each cell having an associated dimension or thickness $x_1$, $x_2$, $x_3$, and associated gap dimensions $x_{1,2}$ and $x_{2,3}$ between respective cells, and the battery 732-1 as a whole may also have an associated dimension or thickness $x_T$. As described herein, an ultrasonic sensor 735-1 may emit ultrasonic waves toward the electrochemical cells and receive echoes of the emitted ultrasonic waves in order to determine changes to physical or mechanical characteristics of the electrochemical cells.

For example, various properties of the ultrasonic waves emitted toward electrochemical cells of batteries may be selected to substantially reflect back from (or pass through) one or more walls, surfaces, peripheries, or boundaries associated with electrochemical cells of the battery 732-1, e.g., based on known properties, surfaces, materials, or other characteristics of such walls, surfaces, peripheries, or boundaries. For example, physical or mechanical changes may cause changes to reflectance, scattering, absorption, or other characteristics of walls, surfaces, peripheries, or boundaries of the electrochemical cells with respect to ultrasonic waves having selected properties. In this manner, the emitted ultrasonic waves may be tuned to reflect back from (or pass through) one or more surfaces of one or more electrochemical cells of the battery 732-1, such that physical dimensions or thicknesses of one or more electrochemical cells, or the battery 732-1 as a whole, may be determined.

As one example, ultrasonic waves emitted by ultrasonic sensor 735-1 may propagate toward the battery 732-1, reflect off a desired wall or surface of an electrochemical cell of the battery 732-1, and return back toward the ultrasonic sensor 735-1. The control system may process data associated with the emitted ultrasonic waves and received echoes of the ultrasonic waves to determine an actual time of flight of the ultrasonic waves. In addition, an expected or reference time of flight of emitted ultrasonic waves reflecting back from the desired wall or surface of the electrochemical cell of the battery 732-1 may be known from previous measurements, based on a known or reference distance between the battery 732-1 and the ultrasonic sensor 735-1, based on other information or data from other sensors, or based on other known or reference data. Based on a comparison of the actual time of flight of the ultrasonic waves with the expected or reference time of flight of ultrasonic waves for the desired wall or surface of the electrochemical cell of the battery 732-1, a difference may be determined, which may correspond to a current, measured, or detected dimension associated with the desired wall or surface of the battery 732-1. Further, multiple measurements of the time of flight of ultrasonic waves for the desired wall or surface of the electrochemical cell of the battery 732-1 may be taken in order to determine changes in dimension over time associated with the desired wall or surface of the battery 732-1.

For example, as shown in FIG. 7A, dimensions or changes in dimension over time associated with thicknesses $x_1$, $x_2$, $x_3$ of each of the cells or a thickness $x_T$ of the battery 732-1 as a whole, as well as associated gap dimensions $x_{1,2}$ and $x_{2,3}$ between respective cells may be determined. As one example, FIG. 7A shows a third cell having a thickness $x_3$ that is relatively larger than thicknesses of the other cells, assuming that all three cells are originally of similar size, shape, and chemistry, which may indicate a change in state of charge and/or state of health of the third cell relative to the other cells of battery 732-1.

In this manner, ultrasonic waves having various selected properties may be emitted toward the battery 732-1 to detect different walls, surfaces, peripheries, or boundaries associated with the various electrochemical cells. Then, dimensions, as well as changes in dimension over time, may be determined for each of the different walls, surfaces, peripheries, or boundaries associated with the various electrochemical cells based at least in part on the actual times of flight of the various emitted ultrasonic waves and reflected echoes of ultrasonic waves.

Accordingly, based at least in part on the determined dimensions, or changes in dimensions over time, and expected or reference times of flight and associated dimensions, states of charge of electrochemical cells of batteries may be determined, potentially with the use of one or more trained machine learning techniques or algorithms. Further, based on changes in dimensions over time and/or comparisons of changes in dimension over time between a plurality of electrochemical cells, and expected or reference changes in dimension, states of health of electrochemical cells of batteries may also be determined, potentially with the use of one or more trained machine learning techniques or algorithms.

As shown in FIG. 7B, a battery 732-2 may include a plurality of electrochemical cells, each cell having an associated chemical or material composition change 738, such as a void fractions 738-1, 738-2 and chemical or material changes 738-3, that may result from gas generation, electrolyte decomposition, material phase changes, chemical decomposition, or other chemical reactions or degradation. As described herein, an ultrasonic sensor 735-2 may emit ultrasonic waves toward the electrochemical cells and receive echoes of the emitted ultrasonic waves in order to determine changes to chemical or material characteristics of the electrochemical cells.

For example, various properties of the ultrasonic waves emitted toward electrochemical cells of batteries may be selected to substantially reflect back from (or pass through) one or more chemical or materials associated with electrochemical cells of the battery 732-2, e.g., based on known properties, phases, elements, or other characteristics of such chemical or materials. For example, chemical or material changes may cause changes to reflectance, scattering, absorption, or other characteristics of chemicals or materials of the electrochemical cells with respect to ultrasonic waves having selected properties. In this manner, the emitted ultrasonic waves may be tuned to reflect back from (or pass through) one or more chemical or materials of one or more electrochemical cells of the battery 732-2, such that chemical or material changes, or void fractions, of one or more electrochemical cells, or the battery 732-2 as a whole, may be determined.

As one example, ultrasonic waves emitted by ultrasonic sensor 735-2 may propagate toward the battery 732-2, the void fraction 738-1 may reflect, scatter, and/or absorb various portions of the ultrasonic waves, and reflected portions of the ultrasonic waves may return back toward the ultrasonic sensor 735-2. The control system may process data associated with the emitted ultrasonic waves and received echoes of the ultrasonic waves to determine one or more actual characteristics, or changes in characteristics, of the received echoes of the ultrasonic waves. In addition, expected or reference characteristics, or changes in characteristics, of echoes reflecting back from expected materials (absent the void fraction 738-1) of the electrochemical cell may be known from previous measurements, based on known or reference characteristics of echoes from materials of similar electrochemical cells, based on other information or data from other sensors, or based on other known or reference data. Based on a comparison of the actual characteristics of the echoes of the ultrasonic waves with the expected or reference characteristics of echoes of the ultrasonic waves for the expected materials of the electrochemical cell of the battery 732-2, a difference may be determined, which may correspond to one or more chemical or material changes, or void fractions of the battery 732-2, potentially with the use of one or more trained machine learning techniques or algorithms. Further, multiple measurements of the actual characteristics of the echoes of the ultrasonic waves for the electrochemical cell of the battery 732-2 may be taken in order to determine changes in characteristics over time of the battery 732-2, potentially with the use of one or more trained machine learning techniques or algorithms.

In this manner, ultrasonic waves having various selected properties may be emitted toward the battery 732-2 to detect different chemical or material changes, void fractions, gas generation, electrolyte decomposition, material phase changes, chemical decomposition, or other chemical reactions or degradation associated with the various electrochemical cells. Then, chemical or material changes, as well as such changes over time, may be determined for each of the various electrochemical cells based at least in part on the actual characteristics of the reflected echoes of various ultrasonic waves.

Accordingly, based at least in part on the determined changes to chemical or material properties, or generation of void fractions, states of health of electrochemical cells of batteries may be determined, potentially with the use of one or more trained machine learning techniques or algorithms.

In some example embodiments, various chemical or material changes to a battery or portions thereof may also cause changes to one or more thicknesses or dimensions of a battery or one or more cells, such as bulging, stretching, elongating, shrinking, contracting, or other physical changes resulting from chemical or material changes. Although such changes to physical or mechanical characteristics of a battery or cells thereof may generally be correlated to changes in state of charge, with the detection of various chemical or material changes that may be the actual causes of such physical changes, the changes to physical or mechanical characteristics of a battery or cells thereof may be more accurately processed and attributed to changes in state of health of a battery or cells thereof. Further, for some battery chemistries, physical changes to dimensions of batteries as a result of changes in states of charge may be an order of magnitude smaller than physical changes to dimensions of batteries as a result of changes in states of health, e.g., due to chemical or material changes that also cause physical changes, which may facilitate distinguishing between physical changes to dimensions of a battery that are caused by changes in state of charge versus those that are caused by changes in state of health.

Although FIGS. 7A and 7B show a particular number, type, configuration, and arrangement of a battery having electrochemical cells and an ultrasonic sensor, various other numbers, types, configurations, and arrangements of batteries and ultrasonic sensors may be used to measure or detect states of charge and/or states of health of electrochemical cells of batteries. In addition, various batteries may include other numbers, types, sizes, and/or dimensions of electrochemical cells, other than three cells of a particular type having relatively equal dimensions as illustrated in FIGS. 7A and 7B. Further, various batteries may include various combinations of both changes to physical or mechanical characteristics and/or changes to chemical or material characteristics, as FIGS. 7A and 7B illustrate such changes separately only as examples and for clarity of discussion.

Figure 8:
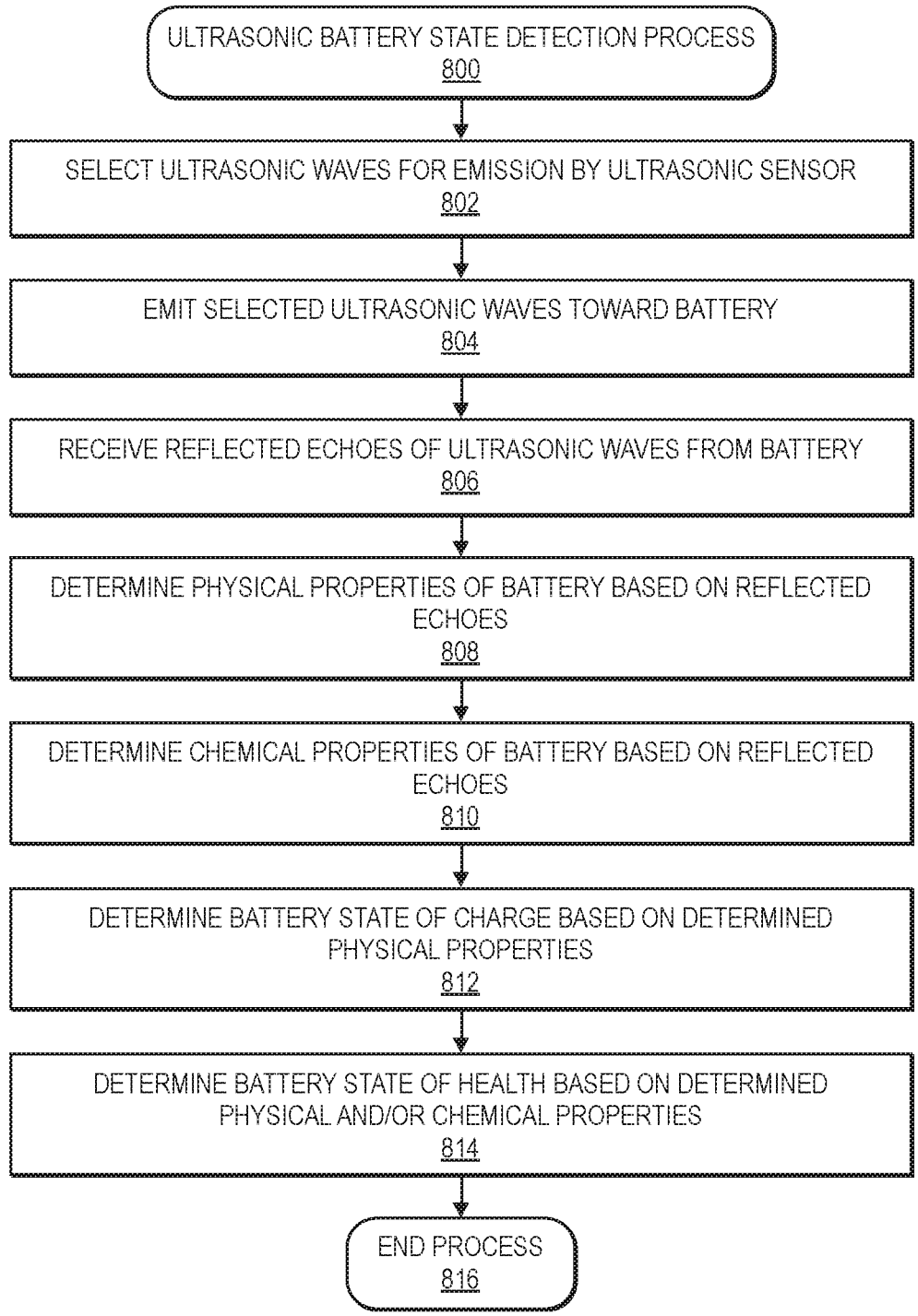
FIG. 8 is a flow diagram illustrating an example ultrasonic battery state detection process, in accordance with disclosed implementations.

FIG. 8 is a flow diagram illustrating an example ultrasonic battery state detection process 800, in accordance with disclosed implementations.

The process 800 may begin by selecting ultrasonic waves for emission by an ultrasonic sensor, as at 802. For example, a control system and/or an aerial vehicle control system may select various properties, such as frequency, wavelength, amplitude, phase, duration, or other properties, associated with ultrasonic waves to be emitted by an ultrasonic sensor toward a battery. The various properties may be selected based on known characteristics associated with the battery or portions thereof, in order to measure or detect particular aspects related to physical or mechanical characteristics of the battery or portions thereof, and/or chemical or material characteristics of the battery or portions thereof.

The process 800 may continue by emitting the selected ultrasonic waves toward the battery, as at 804. For example, a control system and/or an aerial vehicle control system may instruct or command the ultrasonic sensor, transducer, or emitter, to emit ultrasonic waves having the selected properties toward the battery. The ultrasonic waves may be emitted for a duration of time that may be based at least in part on an expected or known distance between the ultrasonic sensor and the battery.

The process 800 may proceed by receiving reflected echoes of the selected ultrasonic waves from the battery, as at 806. For example, a control system and/or an aerial vehicle control system may instruct or command the ultrasonic sensor, transducer, or receiver, to receive echoes of the ultrasonic waves that are reflected back from the battery. The ultrasonic sensor may listen for echoes of the ultrasonic waves for a duration of time that may be based at least in part on an expected or known distance between the ultrasonic sensor and the battery.

The process 800 may then continue with determining physical properties of the battery based on the reflected echoes, as at 808. For example, a control system and/or an aerial vehicle control system may process data associated with the emitted ultrasonic waves and received echoes of the ultrasonic waves to determine actual times of flight of the ultrasonic waves and received echoes. Then, the actual times of flight may be compared with expected or reference times of flight based on known properties of the battery and/or previous measurements to determine differences. Based at least in part on the determined differences between actual and expected times of flight, one or more changes to physical or mechanical characteristics associated with one or more portions of the battery may be determined. Various processing of the ultrasonic waves and received echoes may be performed with the aid of trained machine learning techniques or algorithms, e.g., to determine differences between actual and expected times of flight, as well as to determine correlations of such differences to one or more changes to physical or mechanical characteristics associated with one or more portions of the battery.

The process 800 may then proceed with determining chemical properties of the battery based on the reflected echoes, as at 810. For example, a control system and/or an aerial vehicle control system may process data associated with the emitted ultrasonic waves and received echoes of the ultrasonic waves to determine actual properties or characteristics of the received echoes. Then, the actual properties of the received echoes may be compared with expected or reference properties of echoes of the ultrasonic waves based on known properties of the battery and/or previous measurements to determine differences. Based at least in part on the determined differences between actual and expected properties of the received echoes, one or more changes to chemical or material characteristics associated with one or more portions of the battery may be determined. Various processing of the ultrasonic waves and received echoes may be performed with the aid of trained machine learning techniques or algorithms, e.g., to determine differences between actual and expected properties of the received echoes, as well as to determine correlations of such differences to one or more changes to chemical or material characteristics associated with one or more portions of the battery.

The process 800 may then continue to determine a battery state of charge based on the determined physical properties, as at 812. For example, a control system and/or an aerial vehicle control system may process data associated with the determined one or more changes to physical or mechanical characteristics associated with one or more portions of the battery in order to determine a state of charge, or changes in state of charge, associated with one or more portions of the battery. Various processing of data associated with the determined one or more changes to physical or mechanical characteristics may be performed with the aid of trained machine learning techniques or algorithms, e.g., to determine correlations between changes to physical or mechanical characteristics and states of charge and/or changes in states of charge associated with one or more portions of the battery.

The process 800 may then proceed to determine a battery state of health based on the determined physical and/or chemical properties, as at 814. For example, a control system and/or an aerial vehicle control system may process data associated with the determined one or more changes to physical or mechanical characteristics and/or the determined one or more changes to chemical or material characteristics associated with one or more portions of the battery in order to determine a state of charge, changes in state of charge, a state of health, or changes in state of health associated with one or more portions of the battery. Various processing of data associated with the determined one or more changes to physical or mechanical characteristics and/or the determined one or more changes to chemical or material characteristics may be performed with the aid of trained machine learning techniques or algorithms, e.g., to determine correlations between changes to physical, mechanical, chemical, and/or material characteristics and states of charge, changes in states of charge, states of health, and/or changes in states of health associated with one or more portions of the battery. The process 800 may then end, as at 816.

Moreover, the process 800 may be repeated any number of times to detect various aspects of a battery or cells thereof, including physical properties and/or chemical properties. In addition, the selection of ultrasonic waves may be further refined based on determinations from previously emitted ultrasonic waves and received echoes. In this manner, the detection of particular changes to physical properties and/or chemical properties may be further refined over any number of cycles of the process 800 in order to more precisely and accurately detect changes to various properties of a battery, and thereby more precisely and accurately determine a state of charge and/or state of health of the battery.

Figure 9B:
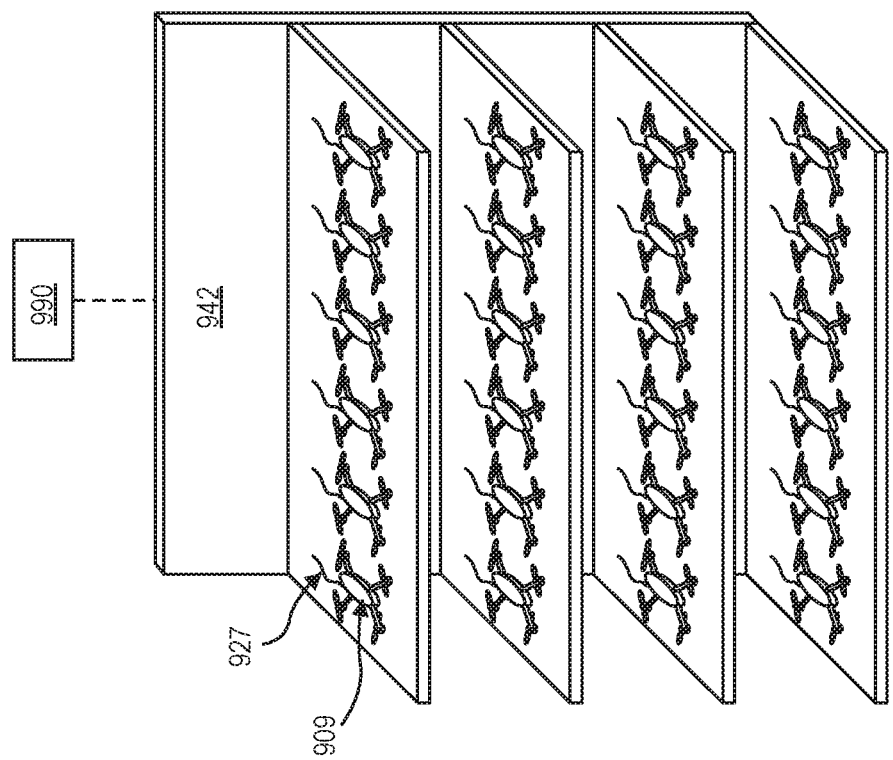
FIGS. 9A and 9B are schematic diagrams of example battery maintenance systems, in accordance with disclosed implementations.
Figure 9A:
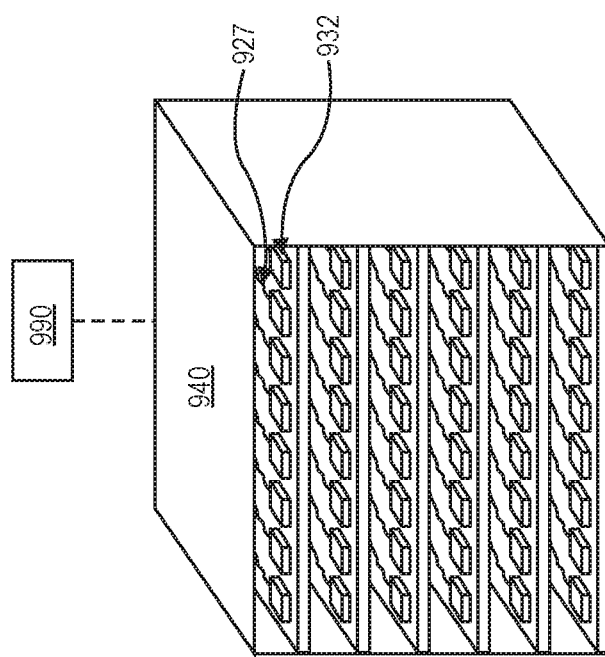

FIGS. 9A and 9B are schematic diagrams of example battery maintenance systems, in accordance with disclosed implementations.

As described herein, batteries such as lithium-ion type batteries, lithium titanate oxide type batteries, or other similar batteries may degrade as a result of use and/or over time. For example, batteries may experience cycle aging as a result of use. Generally, cycle aging may result from the charging and discharging processes that occur during normal, routine, or expected use of batteries to provide power to vehicles, machines, systems, or devices. In addition, batteries may also experience calendar aging due to the passage of time. Generally, calendar aging may result from the gradual, slow degradation of elements, materials, chemicals, portions, or other components of batteries based on an age of the batteries since manufacture.

Thus, even when batteries are not in use and/or maintained in storage, i.e., not experiencing cycle aging, the batteries may still nonetheless gradually degrade over time, i.e., continue to experience calendar aging. Various factors may affect calendar aging of batteries, such as state of charge, temperature, and other factors. For some example batteries and battery chemistries, a state of charge of a battery that is not in use and/or that is maintained in storage may significantly affect the calendar aging rate of the battery. For example, a battery stored at 100% state of charge may experience double or twice the aging rate as a battery stored at 90%, a battery stored at 90% state of charge may experience double or twice the aging rate as a battery stored at 80%, a battery stored at 80% state of charge may experience double or twice the aging rate as a battery stored at 70%, and so on. A preferable range of states of charge for some battery chemistries in order to minimize the calendar aging rate may be between approximately 30% state of charge and approximately 40% state of charge.

In addition, for some example batteries and battery chemistries, a storage temperature of a battery that is not in use and/or that is maintained in storage may also significantly affect the calendar aging rate of the battery. For example, a lower storage temperature may slow down or inhibit chemical reactions that may tend to degrade portions of a battery over time, whereas a higher storage temperature may speed up or facilitate chemical reactions that may tend to degrade portions of a battery over time. A preferable range of storage temperatures for some battery chemistries may be between approximately 10 degrees Celsius and approximately 20 degrees Celsius. In addition, a lower limit of storage temperature for some battery chemistries may be approximately −30 degrees Celsius.

As shown in FIG. 9A, a battery maintenance system may include one or more cabinets, lockers, racks, shelves, or other storage units 940 that are configured to receive a plurality of batteries 932, such as a fleet of batteries to be used by an associated fleet of vehicles, machines, systems, or devices. The one or more cabinets 940 may also include a plurality of compartments, with each compartment configured to receive one or more batteries 932. In some example embodiments, the batteries 932 may comprise a same or similar type or chemistry of battery, and in other example embodiments, the batteries 932 may comprise a plurality of different types or chemistries of batteries.

When stored, inserted, or otherwise placed within a cabinet 940, a battery 932 may also be electrically connected via a cable 927 to each of the other batteries 932 that are stored within the one or more cabinets 940. In addition, each of the connected batteries 932 may also be connected to a power source (not shown). Further, each of the one or more cabinets 940 and/or each of the connected batteries 932 may also be in communication with a control system 990 to control operations and functions of the cabinets 940 and batteries 932. Further details of the control system 990 are described herein with respect to FIG. 12.

Although FIG. 9A shows a particular number, configuration, and arrangement of a cabinet and connected batteries, various other numbers, configurations, and arrangements of one or more cabinets and associated connected batteries may also be included in a battery maintenance system. In some example embodiments, a battery maintenance system may include a plurality of cabinets that may electrically connect between approximately 100 batteries and approximately 200 batteries at one time. In other example embodiments, a battery maintenance system may be sized as a function of a size of the fleet of batteries, a size of the fleet of vehicles or devices, an anticipated or forecast demand for the fleet of batteries, and/or various other factors.

As shown in FIG. 9B, a battery maintenance system may include one or more cabinets, lockers, racks, shelves, or other storage units 942 that are configured to receive a plurality of aerial vehicles 909 (or other vehicles, machines, systems, or devices), such as a fleet of aerial vehicles having associated batteries. The one or more racks 942 may also include a plurality of compartments, with each compartment configured to receive one or more aerial vehicles 909. In some example embodiments, the aerial vehicles 909 may comprise a same or similar type or configuration of aerial vehicle and associated battery, and in other example embodiments, the aerial vehicles 909 may comprise a plurality of different types or configurations of aerial vehicles and associated batteries.

When stored, inserted, or otherwise placed within a rack 942, an aerial vehicle 909 may also be electrically connected via a cable 927 to each of the other aerial vehicles 909 that are stored within the one or more racks 942. In addition, each of the connected aerial vehicles 909 may also be connected to a power source (not shown). Further, each of the one or more racks 942 and/or each of the connected aerial vehicles 909 may also be in communication with a control system 990 to control operations and functions of the racks 942 and aerial vehicles 909. Further details of the control system 990 are described herein with respect to FIG. 12.

Although FIG. 9B shows a particular number, configuration, and arrangement of a rack and connected aerial vehicles, various other numbers, configurations, and arrangements of one or more racks and associated connected aerial vehicles may also be included in a battery maintenance system. In some example embodiments, a battery maintenance system may include a plurality of racks that may electrically connect between approximately 100 aerial vehicles and approximately 200 aerial vehicles at one time. In other example embodiments, a battery maintenance system may be sized as a function of a size of the fleet of vehicles or devices, an anticipated or forecast demand for the fleet of vehicles or devices, and/or various other factors.

Furthermore, although FIGS. 9A and 9B illustrate physical cabinets, lockers, racks, shelves, or other storage units that may receive batteries (or other power sources) and/or aerial vehicles (or other vehicles, machines, systems, or devices), in other example embodiments, a battery maintenance system may not include storage units with any structural components, and instead, the battery maintenance system may simply comprise cables or other electrical connections to electrical connect the fleet of batteries and/or the fleet of vehicles or devices to each other and with a control system.

Moreover, the electrical connections between a fleet of batteries and/or the fleet of vehicles or devices may not be proximally located to each other, e.g., within a same room, area, or space of a facility, warehouse, or building. Instead, the electrical connections between a fleet of batteries and/or the fleet of vehicles or devices may extend between and connect to different portions or sections of a facility, warehouse, or building, e.g., batteries or vehicles electrically connected to a storage unit, in combination with batteries or vehicles electrically connected to a maintenance line or system, as described herein with respect to FIGS. 1-5, and/or batteries or vehicles electrically connected to a battery state detection system, as described herein with respect to FIGS. 6A-8. Further, the electrical connections may extend between and connect batteries or vehicles that are located in different facilities, warehouses, or buildings that may be remote and physically separate from each other.

In addition, in some example embodiments, one or more of the cabinets, lockers, racks, shelves, or storage units 940, 942 may also include or incorporate ultrasonic sensors, ultrasonic transducers, ultrasonic emitters, and/or ultrasonic receivers in order to detect or measure states of charge and/or states of health, as further described herein with respect to FIGS. 6A-8, of a plurality of batteries or vehicles placed within such cabinets or racks 940, 942.

In example embodiments, for a plurality of batteries that are electrically connected as described herein, a control system 990 may adjust, modify, or otherwise alter states of charge of one or more batteries in order to globally minimize an aging rate of the plurality of batteries, while also maintaining a subset, e.g., one or more, of batteries at or near a full state of charge in order to meet expected, anticipated, or forecasted demand for the batteries. Stated differently, the control system may operate a battery maintenance system with a goal of maximizing the probability of maintaining a battery from a fleet of batteries ready to meet demand, given a constraint of reducing the real-time aging rate of a fleet of batteries to less than a threshold percentage loss of capacity per unit time, e.g., less than approximately 0.001% loss of capacity per hour.

In some example embodiments, the control system 990 may adjust states of charge of the plurality of electrically connected batteries in order to maintain a distribution of states of charge among the plurality of batteries. For example, the distribution of states of charge may be a distribution between approximately 10% state of charge and approximately 100% state of charge, a distribution between approximately 20% state of charge and approximately 90% state of charge, a distribution between approximately 30% state of charge and approximately 70% state of charge, a distribution between approximately 20% state of charge and approximately 50% state of charge, or any other distribution.

In other example embodiments, the control system 990 may adjust states of charge of the plurality of electrically connected batteries in order to globally and individually minimize an aging rate of the plurality of batteries. For example, the control system 990 may adjust states of charge to be between approximately 30% state of charge and approximately 40% state of charge, thereby minimizing the aging rate for the plurality of batteries, based on their associated battery chemistries.

In further example embodiments, when a battery that is not at or near a full state of charge is requested for a vehicle, machine, system, or device, the control system may instruct a battery to be provided to a maintenance line or system as described herein with respect to FIGS. 1-5, or other similar system, that may charge and/or charge the battery in preparation for use as part of a vehicle, machine, system, or device. For example, a battery at approximately 30% state of charge may be provided to a power test workstation of a maintenance line and used to replace a previously used battery of a vehicle or device, and the battery may be electrically connected to and charged or charged by a power source during performance of various other maintenance tasks in preparation for further operations.

In still further example embodiments, the control system 990 may adjust a storage temperature of the plurality of batteries in order to globally minimize an aging rate of the plurality of batteries. For example, the control system 990 may adjust the storage temperature to be between approximately 10 degrees Celsius and approximately 20 degrees Celsius, thereby minimizing the aging rate for the plurality of batteries, based on their associated battery chemistries.

In order to adjust, modify, or otherwise alter states of charge of one or more batteries so as to globally minimize an aging rate of the plurality of batteries, while also maintaining a subset of batteries at or near a full state of charge in order to meet expected, anticipated, or forecasted demand for the batteries, the control system may generate, implement, or utilize one or more models or algorithms having various inputs and outputs. In addition, the one or more models or algorithms may also include or utilize various machine learning algorithms or techniques in order to process the various inputs and determine the various outputs.

For example, the various inputs may comprise demand data, degradation data, state of charge data, and other data. The demand data may include historical demand data, current demand data, forecasted demand data, or other demand data. In addition, the demand data may be based at least in part on characteristics of the fleet of batteries, such as number, type, age, capacity, usage, storage, health, or other characteristics of batteries, and/or the demand data may be based at least in part on characteristics of the fleet of vehicles or devices, such as number, type, configuration, power usage profile, or other characteristics of vehicles or devices. The degradation data may include historical data associated with aging and/or degradation of similar batteries, such as similar types or chemistries of batteries, similar usage profiles of batteries, similar storage profiles of batteries, or other data associated with aging and/or degradation of similar batteries. The state of charge data may include current states of charge of the fleet of batteries, which may be detected or measured by various methods, including using ultrasonic sensor systems and methods as described herein with respect to FIGS. 6A-8. Further, various business or financial considerations may also comprise inputs to the one or more models or algorithms, such as the cost of batteries, the replacement cost of batteries, the cost to charge or discharge batteries, the usage cost of batteries, the storage cost of batteries, or other financial or business considerations.

Further, the various outputs of the one or more models or algorithms may comprise desired states of charge of the fleet of batteries and/or desired storage temperatures for the fleet of batteries. As described above, the desired states of charge of the fleet of batteries may include various types of distributions of states of charge among the electrically connected fleet of batteries, and the desired storage temperatures may comprise one or more temperatures at which to store and maintain one or more subset or groups of the fleet of batteries.

Then, based on the various outputs of the one or more models or algorithms, the control system may instruct the cabinets, lockers, racks, shelves, or storage units including a fleet of batteries and/or a fleet of vehicles or devices to implement changes to states of charge of the fleet of batteries and/or the fleet of vehicles or devices, and/or to implement changes to storage temperatures associated with the fleet of batteries and/or the fleet of vehicles or devices. For example, the changes to states of charge may comprise increasing states of charge of a first subset of batteries, decreasing states of charge of a second subset of batteries, maintaining states of charge of a third subset of batteries, and/or transferring charge from a fourth subset of batteries to a fifth subset of batteries to thereby decrease states of charge of the fourth subset of batteries and increase states of charge of the fifth subset of batteries. Such transfer of charge from one or more batteries to one or more other batteries may be possible due to the electrical connection between all, substantially all, or subsets of batteries associated with the battery maintenance system, which transfer may be performed responsive to instructions or commands by a control system.

In this manner, using one or more models or algorithms that receive various inputs, such as demand data, degradation data, and state of charge data, and determine various outputs, such as desired states of charge and desired storage temperatures, a battery maintenance system may minimize the global aging rate of a fleet of batteries, and also maintain a subset of batteries at or near a full state of charge in order to meet expected, anticipated, or forecasted demand for the batteries. Accordingly, the battery maintenance system may maintain availability of at least a subset of a plurality of batteries to meet demand for such batteries, while simultaneously prolonging or extending the useful lives of the plurality of batteries as a whole.

Figure 10:
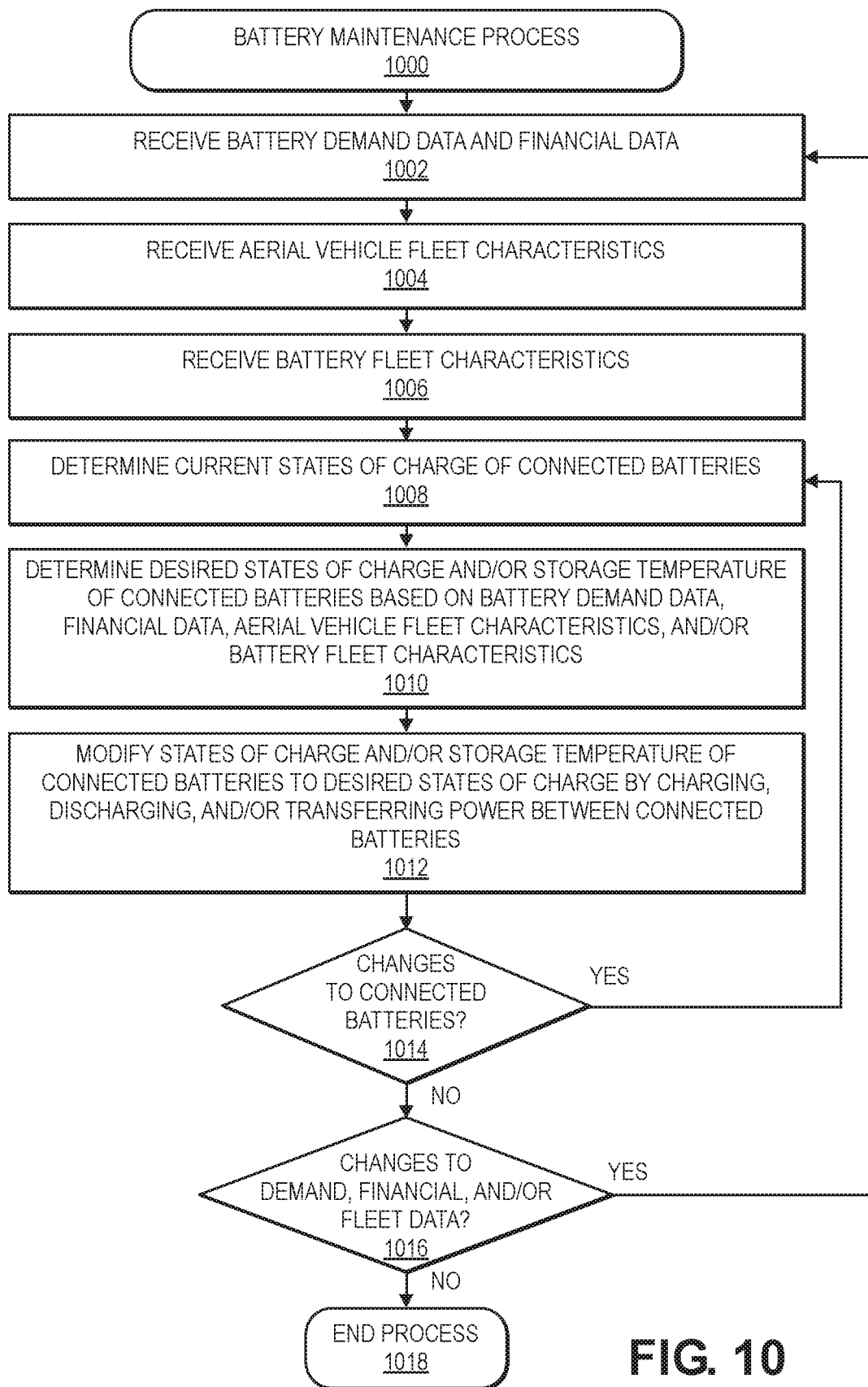
FIG. 10 is a flow diagram illustrating an example battery maintenance process, in accordance with disclosed implementations.

FIG. 10 is a flow diagram illustrating an example battery maintenance process 1000, in accordance with disclosed implementations.

The process 1000 may begin by receiving battery demand data and financial data, as at 1002. For example, as described herein, a control system may receive demand data, such as historical demand data, current demand data, forecasted demand data, or other demand data, and business or financial data, such as cost data, usage cost data, storage cost data, or other data, as inputs to one or more models or algorithms by which to operate a battery maintenance system.

The process 1000 may continue by receiving aerial vehicle fleet characteristics, as at 1004. For example, as described herein, a control system may also receive data associated with vehicle characteristics, such as number, type, configuration, power usage profile, or other characteristics of vehicles, as inputs to one or more models or algorithms by which to operate a battery maintenance system.

The process 1000 may proceed by receiving battery fleet characteristics, as at 1006. For example, as described herein, a control system may also receive data associated with connected battery characteristics, such as number, type, age, capacity, usage, storage, health, or other characteristics of batteries, as inputs to one or more models or algorithms by which to operate a battery maintenance system.

The process 1000 may then continue to determine current states of charge of connected batteries, as at 1008. For example, as described herein, various systems and methods may be used to detect or measure current states of charge of connected batteries. In some example embodiments, ultrasonic sensor systems and methods may be used to detect or measure current states of charge, as further described herein with respect to FIGS. 6A-8. Further, in some examples, ultrasonic sensor systems may be integrated into one or more cabinets or racks associated with a battery maintenance system to detect or measure current states of charge of connected batteries.

The process 1000 may then proceed to determine desired states of charge and/or desired storage temperatures of connected batteries based on the battery demand data, financial data, aerial vehicle fleet characteristics, and/or battery fleet characteristics, as at 1010. For example, the control system may implement or execute the one or more models or algorithms based on the received inputs in order to determine various outputs, such as desired states of charge and/or desired storage temperatures.

The process 1000 may then continue with modifying states of charge and/or storage temperatures of connected batteries to desired states of charge and/or desired storage temperatures by charging, discharging, and/or transferring power between connected batteries and/or by altering storage temperatures, as at 1012. For example, a first subset of connected batteries may be charged to desired states of charge, a second subset of connected batteries may be discharged to desired states of charge, and/or a third subset of connected batteries may be discharged to desired states of charge by transferring power to a fourth subset of connected batteries to be charged to desired states of charge. Various combinations of charging, discharging, and/or transferring power may be possible between a plurality of electrically connected batteries of a battery maintenance system.

The process 1000 may then proceed to determine whether any changes to connected batteries have occurred, as at 1014. For example, one or more batteries may be electrically disconnected from the battery maintenance system, one or more additional batteries may be electrically connected to the battery maintenance system, and/or one or more changes may occur that affect states of charge and/or states of health of one or more connected batteries. If one or more such changes are detected at 1014, then the process 1000 may return to step 1008 to determine current states of charge of the connected batteries as currently determined, determine desired states of charge and/or storage temperatures for the currently connected batteries, and modify the currently connected batteries to such desired states of charge and/or storage temperatures.

If, however, no changes to connected batteries are determined, the process 1000 may continue to determine whether any changes to demand, financial, and/or fleet data have occurred, as at 1016. For example, changes to demand data may modify the desired availability of batteries to meet current, expected, or forecasted demand. In addition, changes to business or financial considerations may alter the desired availability of batteries and/or the desired useful lives of batteries. Likewise, changes to vehicle and/or battery fleet data may result in changes to the desired availability of batteries and/or the desired useful lives of batteries.

If one or more such changes are detected at 1016, then the process 1000 may return to step 1002 to receive additional data associated with demand, financial, and/or fleet data, and the process 1000 described herein may substantially repeat on the basis of the additional data to determine desired states of charge and/or storage temperatures for the connected batteries, and modify the connected batteries to such desired states of charge and/or storage temperatures. If, however, no changes to demand, financial, and/or fleet data are determined, the process 1000 may end, as at 1018.

Although the description herein refers to managing and/or maintaining a fleet of batteries in order to meet demand while also minimizing aging of the batteries, in other example embodiments, the systems described herein that include an electrically connected fleet of batteries may be used for other purposes. For example, various testing of batteries or devices having batteries, such as life cycle testing or other power supply testing, may be performed using the systems described herein that transfer power between subsets of batteries. In addition, various testing of batteries or devices having batteries may be performed during development of such batteries to determine aging rate, state of charge, state of health, voltage, current, power, or other characteristics associated with such batteries. Because the systems described herein may transfer power between subsets of electrically connected batteries, such testing and/or development of batteries may be performed more efficiently and economically without the need to consistently or periodically draw power from external power sources as part of such testing, e.g., by first transferring power from a first subset of batteries to be discharged to a second subset of batteries to be charged, then by transferring power from the second subset of batteries to then be discharged to the first subset of batteries to then be charged, and so on.

FIG. 11 is a block diagram illustrating various components of an aerial vehicle control system or controller 1100, in accordance with disclosed implementations.

In various examples, the block diagram may be illustrative of one or more aspects of the aerial vehicle control system 1100 that may be used to implement the various systems and processes discussed above. Although described with reference to an aerial vehicle, all or portions of the components described herein may form a control system or controller 1100 for any other vehicle, system, machine, apparatus, device, instrument, or object in which the various systems and corresponding methods described herein may be implemented.

In the illustrated implementation, the aerial vehicle control system 1100 includes one or more processors 1102, coupled to a non-transitory computer readable storage medium 1120 via an input/output (I/O) interface 1110. The aerial vehicle control system 1100 may also include an electronic speed controller 1104, a power supply or battery 1106, and/or a navigation system 1108. The aerial vehicle control system 1100 may further include a power supply monitoring module 1112, a network interface 1116, and one or more input/output devices 1118.

In various implementations, the aerial vehicle control system 1100 may be a uniprocessor system including one processor 1102, or a multiprocessor system including several processors 1102 (e.g., two, four, eight, or another suitable number). The processor(s) 1102 may be any suitable processor capable of executing instructions. For example, in various implementations, the processor(s) 1102 may be general-purpose or embedded processors implementing any of a variety of instruction set architectures (ISAs), such as the x86, PowerPC, SPARC, or MIPS ISAs, or any other suitable ISA. In multiprocessor systems, each processor(s) 1102 may commonly, but not necessarily, implement the same ISA.

The non-transitory computer readable storage medium 1120 may be configured to store executable instructions, data, and power supply or battery data and/or characteristics, including ultrasonic wave data, reflected echo data, physical or mechanical characteristics data, chemical or material characteristics data, state of charge data and/or history, state of health data and/or history, various battery or electrochemical cell characteristics data, and/or other data items accessible by the processor(s) 1102. In various implementations, the non-transitory computer readable storage medium 1120 may be implemented using any suitable memory technology, such as static random access memory (SRAM), synchronous dynamic RAM (SDRAM), nonvolatile/Flash-type memory, or any other type of memory. In the illustrated implementation, program instructions and data implementing desired functions, such as those described above, are shown stored within the non-transitory computer readable storage medium 1120 as program instructions 1122, data storage 1124 and power supply data 1126, respectively. In other implementations, program instructions, data and/or power supply data may be received, sent or stored upon different types of computer-accessible media, such as non-transitory media, or on similar media separate from the non-transitory computer readable storage medium 1120 or the aerial vehicle control system 1100.

Generally, a non-transitory, computer readable storage medium may include storage media or memory media such as magnetic or optical media, e.g., disk or CD/DVD-ROM, coupled to the aerial vehicle control system 1100 via the I/O interface 1110. Program instructions and data stored via a non-transitory computer readable medium may be transmitted by transmission media or signals, such as electrical, electromagnetic, or digital signals, which may be conveyed via a communication medium such as a network and/or a wireless link, such as may be implemented via the network interface 1116.

In one implementation, the I/O interface 1110 may be configured to coordinate I/O traffic between the processor(s) 1102, the non-transitory computer readable storage medium 1120, and any peripheral devices, the network interface or other peripheral interfaces, such as input/output devices 1118. In some implementations, the I/O interface 1110 may perform any necessary protocol, timing or other data transformations to convert data signals from one component (e.g., non-transitory computer readable storage medium 1120) into a format suitable for use by another component (e.g., processor(s) 1102). In some implementations, the I/O interface 1110 may include support for devices attached through various types of peripheral buses, such as a variant of the Peripheral Component Interconnect (PCI) bus standard or the Universal Serial Bus (USB) standard, for example. In some implementations, the function of the I/O interface 1110 may be split into two or more separate components, such as a north bridge and a south bridge, for example. Also, in some implementations, some or all of the functionality of the I/O interface 1110, such as an interface to the non-transitory computer readable storage medium 1120, may be incorporated directly into the processor(s) 1102.

The electronic speed control 1104 communicates with the navigation system 1108 and adjusts the operational characteristics of each propulsion mechanism to guide the aerial vehicle along a determined path and/or to perform other navigational maneuvers. The navigation system 1108 may include a GPS or other similar system than can be used to navigate the aerial vehicle to and/or from a location.

The aerial vehicle control system 1100 may also include a power supply monitoring module 1112 that communicates with the processor(s) 1102, the non-transitory computer readable storage medium 1120, ultrasonic sensors, and/or other components to monitor the state of charge and/or the state of health of the power supply 1106, as discussed above.

The network interface 1116 may be configured to allow data to be exchanged between the aerial vehicle control system 1100, other devices attached to a network, such as other computer systems, ultrasonic sensors, and/or control systems of other vehicles, systems, machines, apparatuses, instruments, devices, or objects. For example, the network interface 1116 may enable wireless communication between numerous aerial vehicles. In various implementations, the network interface 1116 may support communication via wireless general data networks, such as a Wi-Fi network. For example, the network interface 1116 may support communication via telecommunications networks such as cellular communication networks, satellite networks, and the like.

Input/output devices 1118 may, in some implementations, include one or more displays, ultrasonic sensors, image capture devices, thermal sensors, infrared sensors, time of flight sensors, accelerometers, pressure sensors, weather sensors, etc. Multiple input/output devices 1118 may be present and controlled by the aerial vehicle control system 1100. One or more of these sensors may be utilized to assist in monitoring the state of charge and/or state of health of the power supply.

As shown in FIG. 11, the memory may include program instructions 1122 which may be configured to implement the example processes and/or sub-processes described above. The data storage 1124 may include various data stores for maintaining data items that may be provided for monitoring a state of charge and/or a state of health of the power supply. For example, the power supply data 1126 and/or the data storage 1124 may include ultrasonic wave data, reflected echo data, physical or mechanical characteristics data, chemical or material characteristics data, state of charge data and/or history, state of health data and/or history, various battery or electrochemical cell characteristics data, and/or other data items.

The power supply data 1126 and/or the data storage 1124 may also include any data related to material, chemical, thermal, electrical, and/or physical properties, operational characteristics, states of charge, states of health, ideal specifications, historical data related to any of the properties and/or characteristics, dimensional data, temperature data, and/or other data related to the power supply and/or individual cells of the power supply.

Figure 12:
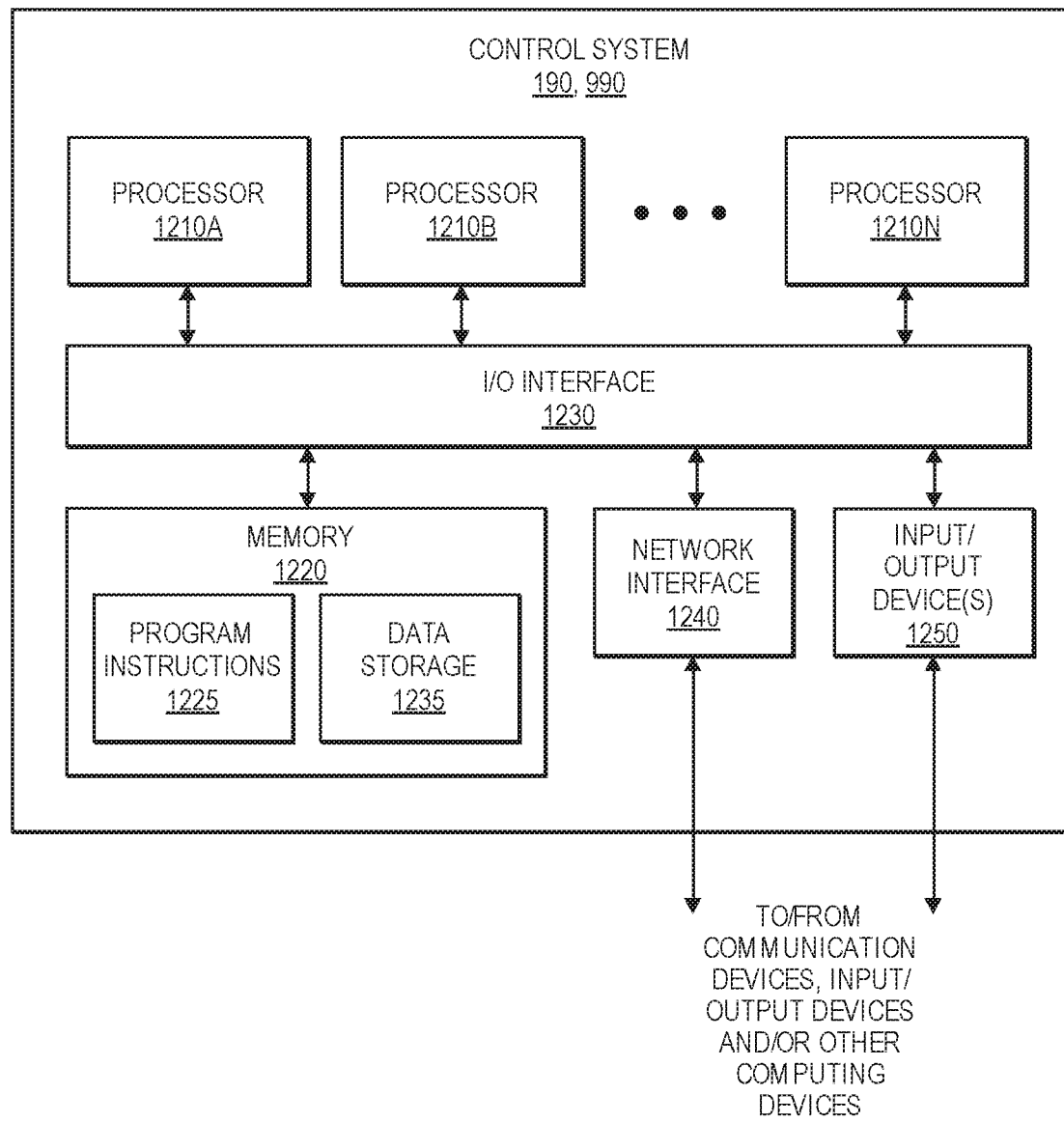
FIG. 12 is a block diagram illustrating various components of a control system, in accordance with disclosed implementations.

FIG. 12 is a block diagram illustrating various components of an example control system 190, 990, in accordance with disclosed implementations.

Various operations of a control system, such as those described herein, may be executed on one or more computer systems, and/or interacting with various other computers, systems, or devices associated with a facility, warehouse, or building, according to various implementations. For example, the control system discussed above may function and operate on one or more computer systems. One such control system is illustrated by the block diagram in FIG. 12. In the illustrated implementation, a control system 190, 990 includes one or more processors 1210A, 1210B through 1210N, coupled to a non-transitory computer-readable storage medium 1220 via an input/output (I/O) interface 1230. The control system 190, 990 further includes a network interface 1240 coupled to the I/O interface 1230, and one or more input/output devices 1250. In some implementations, it is contemplated that a described implementation may be implemented using a single instance of the control system 190, 990 while, in other implementations, multiple such systems or multiple nodes making up the control system 190, 990 may be configured to host different portions or instances of the described implementations. For example, in one implementation, some data sources or services (e.g., related to performing various maintenance tasks, battery charging, battery state detection or measurement, battery fleet maintenance, etc.) may be implemented via one or more nodes of the control system 190, 990 that are distinct from those nodes implementing other data sources or services.

In various implementations, the control system 190, 990 may be a uniprocessor system including one processor 1210A, or a multiprocessor system including several processors 1210A-1210N (e.g., two, four, eight, or another suitable number). The processors 1210A-1210N may be any suitable processor capable of executing instructions. For example, in various implementations, the processors 1210A-1210N may be general-purpose or embedded processors implementing any of a variety of instruction set architectures (ISAs), such as the x86, PowerPC, SPARC, or MIPS ISAs, or any other suitable ISA. In multiprocessor systems, each of the processors 1210A-1210N may commonly, but not necessarily, implement the same ISA.

The non-transitory computer-readable storage medium 1220 may be configured to store executable instructions and/or data accessible by the one or more processors 1210A-1210N. In various implementations, the non-transitory computer-readable storage medium 1220 may be implemented using any suitable memory technology, such as static random access memory (SRAM), synchronous dynamic RAM (SDRAM), nonvolatile/Flash-type memory, or any other type of memory. In the illustrated implementation, program instructions and data implementing desired functions and/or processes, such as those described above, are shown stored within the non-transitory computer-readable storage medium 1220 as program instructions 1225 and data storage 1235, respectively. In other implementations, program instructions and/or data may be received, sent or stored upon different types of computer-accessible media, such as non-transitory media, or on similar media separate from the non-transitory computer-readable storage medium 1220 or the control system 190, 990. Generally speaking, a non-transitory, computer-readable storage medium may include storage media or memory media such as magnetic or optical media, e.g., disk or CD/DVD-ROM, coupled to the control system 190, 990 via the I/O interface 1230. Program instructions and data stored via a non-transitory computer-readable medium may be transmitted by transmission media or signals such as electrical, electromagnetic, or digital signals, which may be conveyed via a communication medium such as a network and/or a wireless link, such as may be implemented via the network interface 1240.

In one implementation, the I/O interface 1230 may be configured to coordinate I/O traffic between the processors 1210A-1210N, the non-transitory computer-readable storage medium 1220, and any peripheral devices, including the network interface 1240 or other peripheral interfaces, such as input/output devices 1250. In some implementations, the I/O interface 1230 may perform any necessary protocol, timing or other data transformations to convert data signals from one component (e.g., non-transitory computer-readable storage medium 1220) into a format suitable for use by another component (e.g., processors 1210A-1210N). In some implementations, the I/O interface 1230 may include support for devices attached through various types of peripheral buses, such as a variant of the Peripheral Component Interconnect (PCI) bus standard or the Universal Serial Bus (USB) standard, for example. In some implementations, the function of the I/O interface 1230 may be split into two or more separate components, such as a north bridge and a south bridge, for example. Also, in some implementations, some or all of the functionality of the I/O interface 1230, such as an interface to the non-transitory computer-readable storage medium 1220, may be incorporated directly into the processors 1210A-1210N.

The network interface 1240 may be configured to allow data to be exchanged between the control system 190, 990 and other devices attached to a network, such as other control systems, computer systems, charging systems, maintenance systems or lines, battery state detection systems, battery fleet maintenance systems, other systems or equipment, or between nodes of the control system 190, 990. In various implementations, the network interface 1240 may support communication via wired or wireless general data networks, such as any suitable type of Ethernet network.

Input/output devices 1250 may, in some implementations, include one or more displays, projection devices, audio input/output devices, keyboards, keypads, touchpads, scanning devices, imaging devices, sensors, proximity sensors, RFID readers, voice or optical recognition devices, or any other devices suitable for entering or retrieving data by one or more control systems 190, 990. Multiple input/output devices 1250 may be present in the control system 190, 990 or may be distributed on various nodes of the control system 190, 990. In some implementations, similar input/output devices may be separate from the control system 190, 990 and may interact with one or more nodes of the control system 190, 990 through a wired or wireless connection, such as over the network interface 1240.

As shown in FIG. 12, the memory 1220 may include program instructions 1225 that may be configured to implement one or more of the described implementations and/or provide data storage 1235, which may comprise various tables, data stores and/or other data structures accessible by the program instructions 1225. The program instructions 1225 may include various executable instructions, programs, or applications to facilitate aerial vehicle maintenance tasks, battery charging, battery state detection or measurement, battery fleet maintenance, or other processes. The data storage 1235 may include various data stores for maintaining data related to maintenance tasks, various battery or electrochemical cell characteristics data, ultrasonic wave data, reflected echo data, physical or mechanical characteristics data, chemical or material characteristics data, state of charge data and/or history, state of health data and/or history, demand data, business or financial data, degradation data, aerial vehicle fleet data, battery fleet data, current state of charge data, desired state of charge data, desired storage temperature data, and/or other data items.

Those skilled in the art will appreciate that the control system 190, 990 is merely illustrative and is not intended to limit the scope of implementations. In particular, the control system and devices may include any combination of hardware or software that can perform the indicated functions, including computers, network devices, internet appliances, robotic devices, etc. The control system 190, 990 may also be connected to other devices that are not illustrated, or instead may operate as a stand-alone system. In addition, the functionality provided by the illustrated components may in some implementations be combined in fewer components or distributed in additional components. Similarly, in some implementations, the functionality of some of the illustrated components may not be provided and/or other additional functionality may be available.

Those skilled in the art will appreciate that, in some implementations, the functionality provided by the methods, systems, and apparatus discussed above may be provided in alternative ways, such as being split among more software modules or routines or consolidated into fewer modules or routines, and/or being split into additional or fewer robotic or automated units. Similarly, in some implementations, illustrated methods and systems may provide more or less functionality than is described, such as when other illustrated methods instead lack or include such functionality respectively, or when the amount of functionality that is provided is altered. In addition, while various operations may be illustrated as being performed in a particular manner (e.g., in serial or in parallel) and/or in a particular order, those skilled in the art will appreciate that, in other implementations, the operations may be performed in other orders and in other manners. The various methods, apparatus, and systems as illustrated in the figures and described herein represent example implementations. The methods and systems may be implemented in software, hardware, or a combination thereof in other implementations. Similarly, the order of any method may be changed and various features may be added, reordered, combined, omitted, modified, etc., in other implementations.

Aspects of the disclosed system may be implemented as a computer method or as an article of manufacture such as a memory device or non-transitory computer readable storage medium. The computer readable storage medium may be readable by a computer and may comprise instructions for causing a computer or other device to perform processes described in the present disclosure. The computer readable storage media may be implemented by a volatile computer memory, non-volatile computer memory, hard drive, solid-state memory, flash drive, removable disk and/or other media. In addition, components of one or more of the modules and nodes may be implemented in firmware or hardware.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

Language of degree used herein, such as the terms "about," "approximately," "generally," "nearly" or "substantially" as used herein, represent a value, amount, or characteristic close to the stated value, amount, or characteristic that still performs a desired function or achieves a desired result. For example, the terms "about," "approximately," "generally," "nearly" or "substantially" may refer to an amount that is within less than 10% of, within less than 5% of, within less than 1% of, within less than 0.1% of, and/or within less than 0.01% of the stated amount.

As used throughout this application, the word "may" is used in a permissive sense (i.e., meaning having the potential to), rather than the mandatory sense (i.e., meaning must). Similarly, the words "include," "including," and "includes" mean including, but not limited to. Additionally, as used herein, the term "coupled" may refer to two or more components connected together, whether that connection is permanent (e.g., welded) or temporary (e.g., bolted), direct or indirect (e.g., through an intermediary), mechanical, chemical, optical, or electrical.

From the foregoing, it will be appreciated that, although specific implementations have been described herein for purposes of illustration, various modifications may be made without deviating from the spirit and scope of the appended claims and the features recited therein. In addition, while certain aspects are presented below in certain claim forms, the inventors contemplate the various aspects in any available claim form. For example, while only some aspects may currently be recited as being embodied in a non-transitory computer-readable storage medium, other aspects may likewise be so embodied. Various modifications and changes may be made as would be obvious to a person skilled in the art having the benefit of this disclosure. It is intended to embrace all such modifications and changes and, accordingly, the above description is to be regarded in an illustrative rather than a restrictive sense.

What is claimed is:

1. A battery monitoring system, comprising:
a battery comprising a plurality of stacked cells;
an ultrasonic sensor that emits ultrasonic waves toward the battery, and receives echoes of emitted ultrasonic waves reflected back from the battery; and
a control system in communication with the ultrasonic sensor and configured to at least:
instruct the ultrasonic sensor to emit ultrasonic waves toward the battery;
instruct the ultrasonic sensor to receive echoes of the emitted ultrasonic waves reflected back from the battery;
process the emitted ultrasonic waves and the received echoes of emitted ultrasonic waves to determine an actual time of flight;
determine physical characteristics associated with the battery based at least in part on the actual time of flight associated with the emitted ultrasonic waves and the received echoes of emitted ultrasonic waves; and
calculate a state of charge of the battery based at least in part on the determined physical characteristics.

2. The battery monitoring system of claim 1, wherein the battery and the ultrasonic sensor are associated with an aerial vehicle.

3. The battery monitoring system of claim 2, wherein the ultrasonic sensor emits ultrasonic waves and receives echoes of emitted ultrasonic waves during operation of the aerial vehicle.

4. The battery monitoring system of claim 1, wherein the battery is associated with an aerial vehicle, and the ultrasonic sensor is associated with a platform that receives the aerial vehicle.

5. The battery monitoring system of claim 4, wherein the platform is configured to move among a plurality of workstations associated with an aerial vehicle maintenance system.

6. A system, comprising:
a battery comprising at least one cell;
an ultrasonic sensor that emits an ultrasonic wave toward the battery, and receives an echo of the emitted ultrasonic wave reflected back from the battery; and
a control system in communication with the ultrasonic sensor and configured to at least:
process the emitted ultrasonic wave and the received echo of the emitted ultrasonic wave to determine at least one property associated with the received echo;
determine at least one of a physical characteristic or a chemical characteristic associated with the battery based at least in part on the determined at least one property associated with the received echo; and
calculate at least one of a state of charge or a state of health of the battery based at least in part on the determined at least one of the physical characteristic or the chemical characteristic.

7. The system of claim 6, wherein the ultrasonic sensor acts as both an ultrasonic emitter and an ultrasonic receiver.

8. The system of claim 6, wherein the control system is further configured to at least:
select at least one property associated with the emitted ultrasonic wave.

9. The system of claim 8, wherein the at least one property comprises at least one of a frequency, an amplitude, a wavelength, a phase, or a duration.

10. The system of claim 8, wherein the determined at least one property associated with the received echo comprises at least one of a time of flight, a second frequency, a second amplitude, a second wavelength, a second phase, or a second duration;
wherein the at least one of the second frequency, the second amplitude, the second wavelength, the second phase, or the second duration associated with the received echo are different from the at least one of the frequency, the amplitude, the wavelength, the phase, or the duration associated with the emitted ultrasonic wave.

11. The system of claim 6, wherein the physical characteristic comprises a change in at least one of a size, a shape, a thickness, or a surface associated with the at least one cell.

12. The system of claim 6, wherein the state of charge of the battery is calculated based at least in part on the physical characteristic.

13. The system of claim 6, wherein the chemical characteristic comprises a change in at least one of a composition or a phase associated with a material of the at least one cell.

14. The system of claim 6, wherein the chemical characteristic comprises a void within a material of the at least one cell.

15. The system of claim 6, wherein the state of health of the battery is calculated based at least in part on at least one of the physical characteristic or the chemical characteristic.

16. A method, comprising:
- emitting, by an ultrasonic emitter, an ultrasonic wave toward a battery comprising at least one cell;
- receiving, by an ultrasonic receiver, an echo of the ultrasonic wave reflected back from the battery;
- processing, by a control system, the ultrasonic wave and the echo of the ultrasonic wave to determine at least one property associated with the echo;
- determining, by the control system, at least one of a physical characteristic or a chemical characteristic associated with the battery based at least in part on the determined at least one property associated with the echo; and
- calculating, by the control system, at least one of a state of charge or a state of health of the battery based at least in part on the determined at least one of the physical characteristic or the chemical characteristic.

17. The method of claim 16, further comprising:
- selecting a first property associated with the ultrasonic wave to determine a physical characteristic associated with the battery.

18. The method of claim 17, wherein the first property comprises at least one of a first frequency, a first amplitude, a first wavelength, a first phase, or a first duration; and
- wherein the at least one property associated with the echo comprises at least one of a time of flight, a third frequency, a third amplitude, a third wavelength, a third phase, or a third duration.

19. The method of claim 16, further comprising:
- selecting a second property associated with the ultrasonic wave to determine a chemical characteristic associated with the battery.

20. The method of claim 19, wherein the second property comprises at least one of a second frequency, a second amplitude, a second wavelength, a second phase, or a second duration; and
- wherein the at least one property associated with the echo comprises at least one of a time of flight, a fourth frequency, a fourth amplitude, a fourth wavelength, a fourth phase, or a fourth duration.

* * * * *